United States Patent
Yamamoto et al.

(10) Patent No.: US 9,263,268 B2
(45) Date of Patent: Feb. 16, 2016

(54) JOINING DEVICE, JOINING SYSTEM AND JOINING METHOD

(71) Applicant: TOKYO ELECTRON LIMITED, Tokyo (JP)

(72) Inventors: Masahiro Yamamoto, Tokyo (JP); Shintaro Sugihara, Kumamoto (JP); Hajime Furuya, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/281,152

(22) Filed: May 19, 2014

(65) Prior Publication Data
US 2014/0349465 A1    Nov. 27, 2014

(30) Foreign Application Priority Data
May 21, 2013  (JP) .................................. 2013-106781

(51) Int. Cl.
*H01L 21/00* (2006.01)
*H01L 21/18* (2006.01)
*H01L 21/68* (2006.01)
*H01L 21/67* (2006.01)

(52) U.S. Cl.
CPC ........ *H01L 21/187* (2013.01); *H01L 21/67092* (2013.01); *H01L 21/67109* (2013.01); *H01L 21/67248* (2013.01); *H01L 21/68* (2013.01)

(58) Field of Classification Search
CPC .. H01L 21/187; H01L 21/68; H01L 21/67248
See application file for complete search history.

(56) References Cited

U.S. PATENT DOCUMENTS

2014/0349465 A1*  11/2014  Yamamoto ............ H01L 21/187
                                                          438/455

FOREIGN PATENT DOCUMENTS

JP        2011-181633         9/2011

* cited by examiner

*Primary Examiner* — Richard Booth
(74) *Attorney, Agent, or Firm* — Nath Goldberg & Meyer; Jerald L. Meyer

(57) ABSTRACT

A joining device for joining substrates with an intermolecular force includes a first holding unit configured to hold a first substrate on a lower surface thereof, a second holding unit installed below the first holding unit and configured to hold a second substrate on an upper surface thereof, and a temperature adjustment mechanism configured to adjust a temperature of the first substrate before the first substrate is held in the first holding unit and a temperature of the second substrate before the second substrate is held in the second holding unit to a predetermined temperature.

13 Claims, 24 Drawing Sheets

JOINING DEVICE, JOINING SYSTEM AND JOINING METHOD

CROSS-REFERENCE TO RELATED APPLICATION

This application claims the benefit of Japanese Patent Application No. 2013-106781, filed on May 21, 2013, in the Japan Patent Office, the disclosure of which is incorporated herein in its entirety by reference.

TECHNICAL FIELD

The present disclosure relates to a joining device configured to join substrates together, a joining system, and a joining method.

BACKGROUND

In recent years, high integration of a semiconductor device is in progress. If a plurality of highly-integrated semiconductor devices is disposed within a horizontal plane and if the semiconductor devices are formed into a final product by connecting them with wiring lines, the length of the wiring lines becomes longer. Thus, there is a fear that the resistance of the wiring lines grows larger and the wiring delay becomes severe.

Under the circumstances, there has been proposed the use of a three-dimensional integration technology that three-dimensionally stacks semiconductor devices. In this three-dimensional integration technology, two semiconductor wafers (hereinafter referred to as "wafers") are joined through the use of, e.g., a joining system. For example, the joining system includes a surface modification device (a surface activation device) configured to modify the surfaces of the wafers to be joined, a surface hydrophilization device configured to hydrophilize the surfaces of the wafers modified by the surface modification device, and a joining device configured to join the wafers whose surfaces are hydrophilized by the surface hydrophilization device. In this joining system, the surface hydrophilization device supplies pure water to the surfaces of the wafers to thereby hydrophilize the surfaces of the wafers. Thereafter, the joining device joins the wafers with a Van der Waals force and a hydrogen bond (an intermolecular force).

In the joining device, one wafer (hereinafter referred to as an "upper wafer") is held by an upper chuck and another wafer (hereinafter referred to as a "lower wafer") is held by a lower chuck installed below the upper chuck. In this state, the upper wafer and the lower wafer are joined together. In order to increase the Van der Waals force and to promote the hydrogen bond at this time, it has been proposed to install cooling mechanisms in the upper chuck and the lower chuck and to join the upper wafer and the lower wafer while cooling them.

However, this joining device fails to control and manage the temperature of the upper wafer not yet held in the upper chuck and the temperature of the lower wafer not yet held in the lower chuck. For that reason, there is a fear that, prior to the upper wafer and the lower wafer being held in the upper chuck and the lower chuck, variations in the temperatures of the upper wafer and the lower wafer may occur due to various external causes. In particular, the upper wafer and the lower wafer are independently transferred to the upper chuck and the lower chuck. Therefore, the standby time is not consistent and variations in the standby time easily occur.

In the meantime, it is known that, if the temperatures of the upper wafer and the lower wafer are changed, the shapes thereof are also changed. In the case of, e.g., a silicon wafer, if the temperature thereof increases 1 degree C., the diameter thereof increases several micrometers due to thermal expansion.

When joining the upper wafer and the lower wafer, it is required that the joining position of the upper wafer and the lower wafer be controlled at a micrometer level. If variations exist in the temperatures of the upper wafer and the lower wafer as mentioned above and if the variations caused by the temperature variations exist in the dimensions and shapes of the upper wafer and the lower wafer, it is impossible to accurately control the joining position. Consequently, there is a fear that, when joining the upper wafer and the lower wafer, they may be joined in a misaligned state.

As an example, it is conceivable to individually adjust the temperatures of the upper wafer and the lower wafer through the use of cooling mechanisms for the upper chuck and the lower chuck. However, in this case, the temperature adjustment is performed after the upper wafer and the lower wafer are held in the upper chuck and the lower chuck. Thus, time is required in the temperature adjustment. For that reason, the timing of starting the adjustment of the positions of the upper wafer and the lower wafer are delayed. This makes it impossible to rapidly perform the position adjustment.

As pointed out above, there is room for improvement in the wafer joining process of the related art.

SUMMARY

Some embodiments of the present disclosure seek to appropriately adjust the positions of a first substrate held in a first holding unit and a second substrate held in a second holding unit and to provide a joining device, a joining system and a joining method which appropriately perform the joining of the substrates.

According to an embodiment of the present disclosure, provided is a joining device for joining substrates with an intermolecular force, including a first holding unit configured to hold a first substrate on a lower surface thereof, a second holding unit installed below the first holding unit and configured to hold a second substrate on an upper surface thereof, and a temperature adjustment mechanism configured to adjust a temperature of the first substrate before the first sbustrate is held in the first holding unit and a temperature of the second substrate before the second substrate is held in the second holding unit to a predetermined temperature.

According to an embodiment of the present disclosure, provided is a joining system provided with the joining device described above, having a processing station including the joining device, and a carry-in/carry-out station capable of holding a first substrate, a second substrate or a superposed substrate obtained by joining the first substrate and the second substrate and configured to carry the first substrate, the second substrate or the superposed substrate into and out of the processing station, wherein the processing station including a surface modification device configured to modify a front surface of the first substrate or the second substrate to be joined, a surface hydrophilization device configured to hydrophilize the front surface of the first substrate or the second substrate modified in the surface modification device, and a transfer device configured to transfer the first substrate, the second substrate or the superposed surface with respect to the surface modification device, the surface hydrophilization device and the joining device, wherein the joining device joins the first substrate and the second substrate whose front surfaces are hydrophilized in the surface hydrophilization device.

According to an embodiment of the present disclosure, provided is a joining method for joining substrates with an intermolecular force, including a first temperature adjustment process of adjusting a temperature of a first substrate to a predetermined temperature with a temperature adjustment mechanism, a second temperature adjustment process of adjusting a temperature of the second substrate to a predetermined temperature with the temperature adjustment mechanism, and a joining process of holding on a lower surface of a first holding unit the first substrate whose temperature is adjusted in the first temperature adjustment process, holding on an upper surface of a second holding unit the second substrate whose temperature is adjusted in the second temperature adjustment process, and then joining the first substrate held in the first holding unit and the second substrate held in the second holding unit by disposing the first substrate and the second substrate to face each other.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
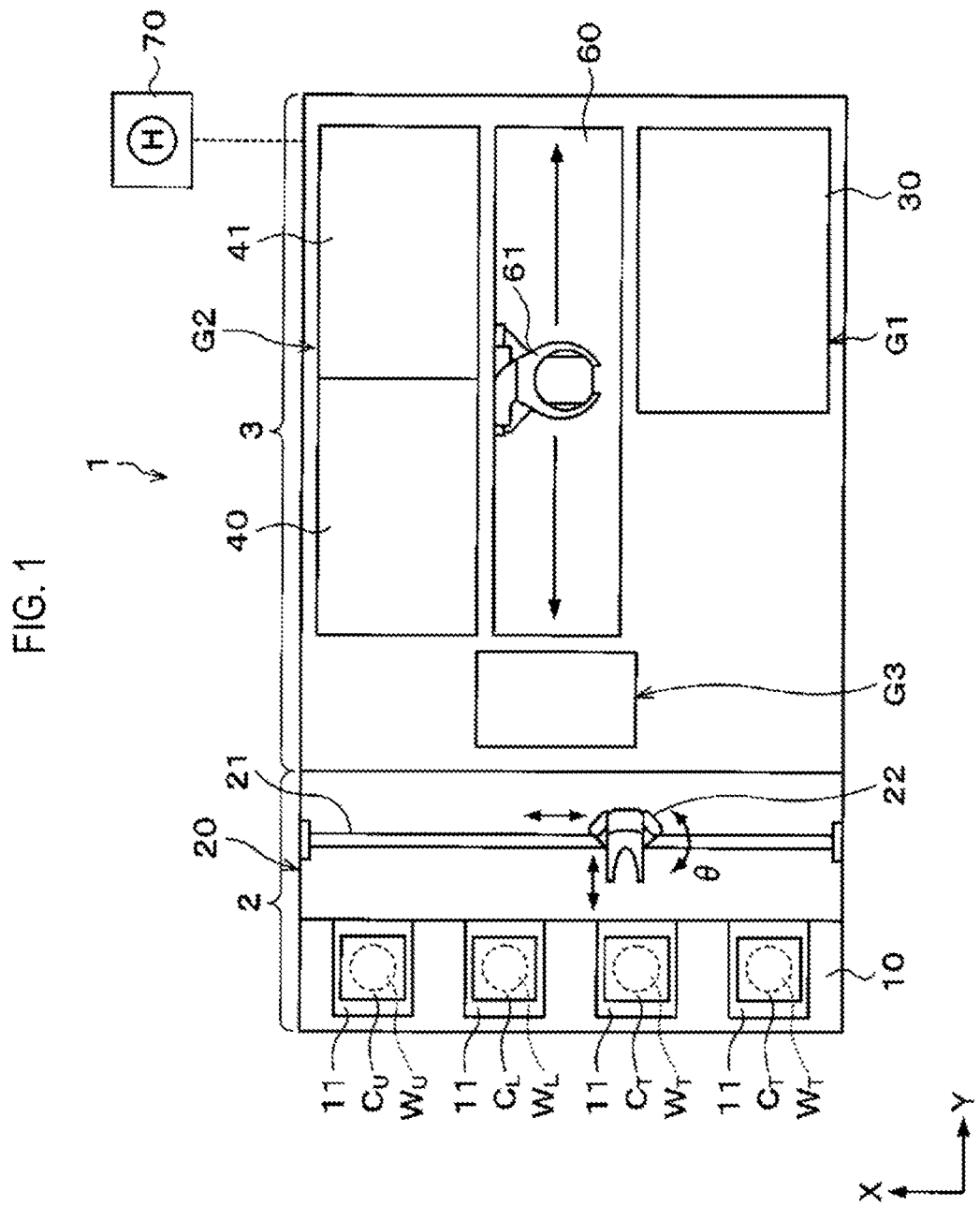
FIG. 1 is a plan view showing a schematic configuration of a joining system according to the present embodiment.
Figure 2:
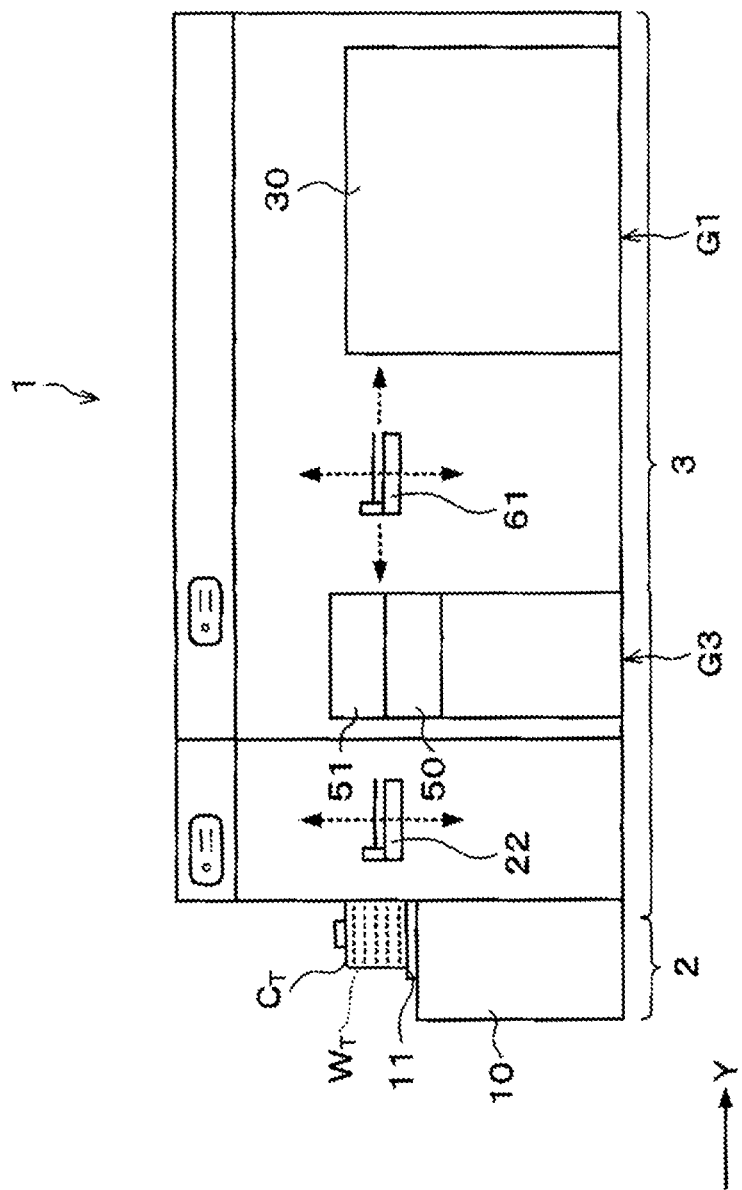
FIG. 2 is a side view showing a schematic internal configuration of the joining system according to the present embodiment.

FIG. 1 is a plan view showing a schematic configuration of a joining system 1 according to the present embodiment. FIG. 2 is a side view showing a schematic internal configuration of the joining system 1 according to the present embodiment.

Figure 3:
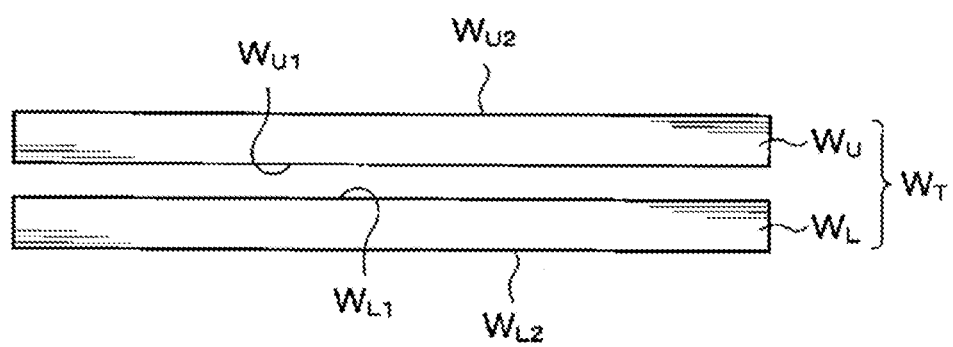
FIG. 3 is a side view showing schematic configurations of an upper wafer and a lower wafer.

The joining system 1 joins, e.g., two wafers $W_U$, $W_L$ as substrates as shown in FIG. 3. In the following description, a wafer positioned at the upper side will be referred to as an "upper wafer $W_U$" as a first substrate, and a wafer positioned at the lower side will be referred to as a "lower wafer $W_L$" as a second substrate. The joining surface of the upper wafer $W_U$ to be joined will be referred to as a "front surface $W_{U1}$", and the opposite surface of the upper wafer $W_U$ from the front surface $W_{U1}$ will be referred to as a "rear surface $W_{U2}$". Similarly, the joining surface of the lower wafer $W_L$ to be joined will be referred to as a "front surface $W_{L1}$", and the opposite surface of the upper wafer $W_L$ from the front surface $W_{L1}$ will be referred to as a "rear surface $W_{L2}$". The joining system 1 forms a superposed wafer $W_T$ as a superposed substrate by joining the upper wafer $W_U$ and the lower wafer $W_L$ together.

In the present embodiment, the upper wafer $W_U$ is a wafer that becomes a product. For example, a plurality of devices including a plurality of electronic circuits and the like is formed on the front surface $W_{U1}$ of the upper wafer $W_U$. The lower wafer $W_L$ is a wafer configured to support the upper wafer $W_U$.

As shown in FIG. 1, the joining system 1 includes a carry-in/carry-out station 2 and a processing station 3 which are serially connected to each other. Cassettes $C_U$, $C_L$, and $C_T$ respectively capable of accommodating a plurality of wafers $W_U$ and $W_L$ and a plurality of superposed wafers $W_T$ are carried from the outside into the carry-in/carry-out station 2 and are carried from the carry-in/carry-out station 2 to the outside. The processing station 3 is provided with different kinds of processing devices which implement specified processing with respect to the superposed wafers $W_T$.

A cassette mounting table 10 is installed in the carry-in/carry-out station 2. A plurality of (e.g., four) cassette mounting boards 11 is installed on the cassette mounting table 10. The cassette mounting boards 11 are arranged in a line along a horizontal X-direction (an up-down direction in FIG. 1). The cassettes $C_U$, $C_L$ and $C_T$ can be mounted on the cassette mounting boards 11 when carrying the cassettes $C_U$, $C_L$ and $C_T$ from the outside into the joining system 1 and carrying the cassettes $C_U$, $C_L$ and $C_T$ from the joining system 1 to the outside. In this way, the carry-in/carry-out station 2 is configured to hold the upper wafers $W_U$, the lower wafers $W_L$ and the superposed wafers $W_T$. The number of cassette mounting boards 11 is not limited to this embodiment but may be arbitrarily decided. One of the cassettes may be used as a collection cassette for collecting defective wafers. That is to say, the collection cassette is a cassette by which the defective wafers each having a defect caused by various factors when joining the upper wafer $W_U$ and the lower wafer $W_L$ can be separated from other normal superposed wafers $W_T$. In this embodiment, one of the cassettes $C_T$ is used as the collection cassette for collecting the defective wafers, and other cassettes $C_T$ are used to accommodate the normal superposed wafers $W_T$.

In the carry-in/carry-out station 2, a wafer transfer section 20 is installed adjacent to the cassette mounting table 10. A wafer transfer device 22 movable along a transfer path 21 extending in the X-direction is installed in the wafer transfer section 20. The wafer transfer device 22 is movable in a vertical direction and about a vertical axis (in a θ direction) and is capable of transferring the upper wafer $W_U$, the lower wafer $W_L$ and the superposed wafer $W_T$ between the cassettes $C_U$, $C_L$ and $C_T$ mounted on the respective cassette mounting boards 11 and the below-mentioned transition devices 50 and 51 of a third processing block G3 of the processing station 3.

A plurality of (e.g., three) processing blocks G1, G2 and G3 including various kinds of devices is installed in the processing station 3. For example, a first processing block G1 is installed at the front side of the processing station 3 (at the negative side in the X-direction in FIG. 1). A second processing block G2 is installed at the back side of the processing station 3 (at the positive side in the X-direction in FIG. 1). A third processing block G3 is installed at the side of the carry-in/carry-out station 2 in the processing station 3 (at the negative side in a Y-direction in FIG. 1).

For example, in the first processing block G1, a surface modification device 30 configured to modify the front surfaces $W_{U1}$ and $W_{L1}$ of the upper wafer $W_U$ and lower wafer $W_L$ is disposed. In the surface modification device 30, an oxygen gas as a process gas is excited, converted to plasma and ionized under, e.g., a depressurized environment. The oxygen ions are irradiated on the front surfaces $W_{U1}$ and $W_{L1}$, whereby the front surfaces $W_{U1}$ and $W_{L1}$ are plasma-processed and modified.

For example, in the second processing block G2, a surface hydrophilization device 40 configured to hydrophilize and clean the front surfaces $W_{U1}$ and $W_{L1}$ of the upper wafer $W_U$ and lower wafer $W_L$ with, e.g., pure water, and a joining device 41 configured to join the upper and lower wafers $W_U$ and $W_L$ are disposed in the named order from the side of the carry-in/carry-out station 2 along the horizontal Y-direction.

In the surface hydrophilization device 40, pure water is supplied onto the upper and lower wafers $W_U$ and $W_L$ while rotating the upper and lower wafers $W_U$ and $W_L$ held in, e.g., a spin chuck. The pure water thus supplied is diffused on the front surfaces $W_{U1}$ and $W_{L1}$ of the upper and lower wafers $W_U$ and $W_L$, whereby the front surfaces $W_{U1}$ are hydrophilized. The configuration of the joining device 41 will be described later.

For example, in the third processing block G3, transition devices 50 and 51 for the upper and lower wafers $W_U$ and $W_L$ and the superposed wafers $W_T$ are installed in two stages one above another from below as shown in FIG. 2.

As shown in FIG. 1, a wafer transfer region 60 is formed in an area surrounded by the first processing block G1, the second processing block G2 and the third processing block G3. For example, a wafer transfer device 61 is arranged in the wafer transfer region 60.

The wafer transfer device 61 includes a transfer arm which can move, e.g., in the vertical direction and the horizontal direction (in the Y-direction and the X-direction) and about the vertical axis. The wafer transfer device 61 can move within the wafer transfer region 60 and can transfer the upper and lower wafers $W_U$ and $W_L$ and the superposed wafer $W_T$ to a specified device existing within the first processing block G1, the second processing block G2 or the third processing block G3 disposed around the wafer transfer region 60.

As shown in FIG. 1, a control unit 70 is installed in the joining system 1 described above. The control unit 70 is, e.g., a computer, and is provided with a program storage unit (not shown). The program storage unit stores a program that controls the processing of the upper and lower wafers $W_U$ and $W_L$ and the superposed wafer $W_T$ in the joining system 1. Furthermore, the program storage unit stores a program for controlling the operations of various kinds of processing devices described above and the operations of drive systems such as the transfer device and the like and for realizing the below-mentioned wafer joining process in the joining system 1. The aforementioned programs are recorded in a computer-readable storage medium H such as, e.g., a hard disc (HD), a flexible disc (FD), a compact disc (CD), a magneto-optical disc (MO) or a memory card. The programs may be installed in the control unit 70 from the storage medium H.

Figure 4:
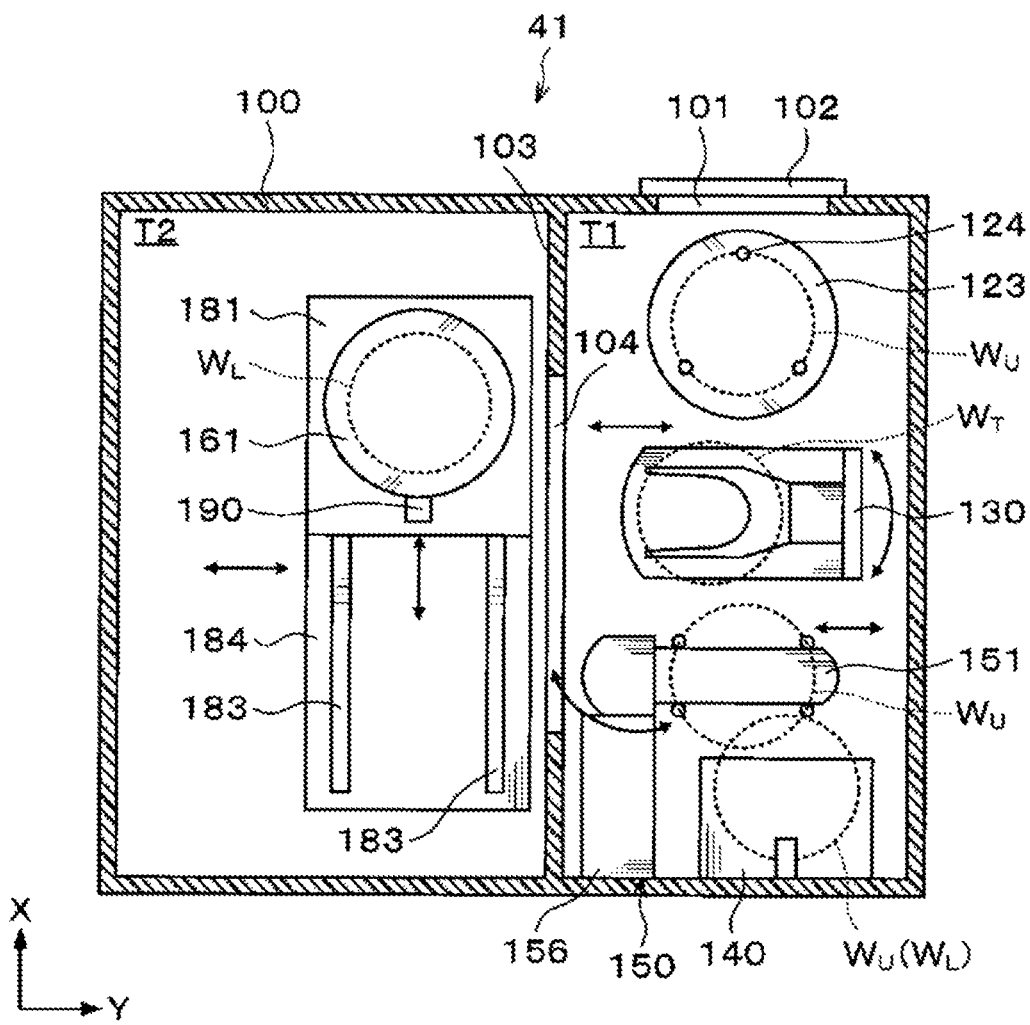
FIG. 4 is a horizontal sectional view showing a schematic configuration of a joining device.

Next, description will be made on the configuration of the aforementioned joining device 41. As shown in FIG. 4, the joining device 41 includes a processing vessel 100, the interior of which is hermetically sealable. A carry-in/carry-out gate 101 through which the upper and lower wafers $W_U$ and $W_L$ and the superposed wafer $W_T$ are carried is formed on the side surface of the processing vessel 100 adjoining the wafer transfer region 60. An opening/closing shutter 102 is installed in the carry-in/carry-out gate 101.

The interior of the processing vessel 100 is divided into a transfer region T1 and a processing region T2 by an internal wall 103. The carry-in/carry-out gate 101 is formed on the side surface of the processing vessel 100 corresponding to the transfer region T1. A carry-in/carry-out gate 104 through which the upper and lower wafers $W_U$ and $W_L$ and the superposed wafer $W_T$ are carried is also formed in the internal wall 103. The internal environment of the processing region T2 is maintained at a predetermined temperature, e.g., 25 degrees C.

Figure 5:
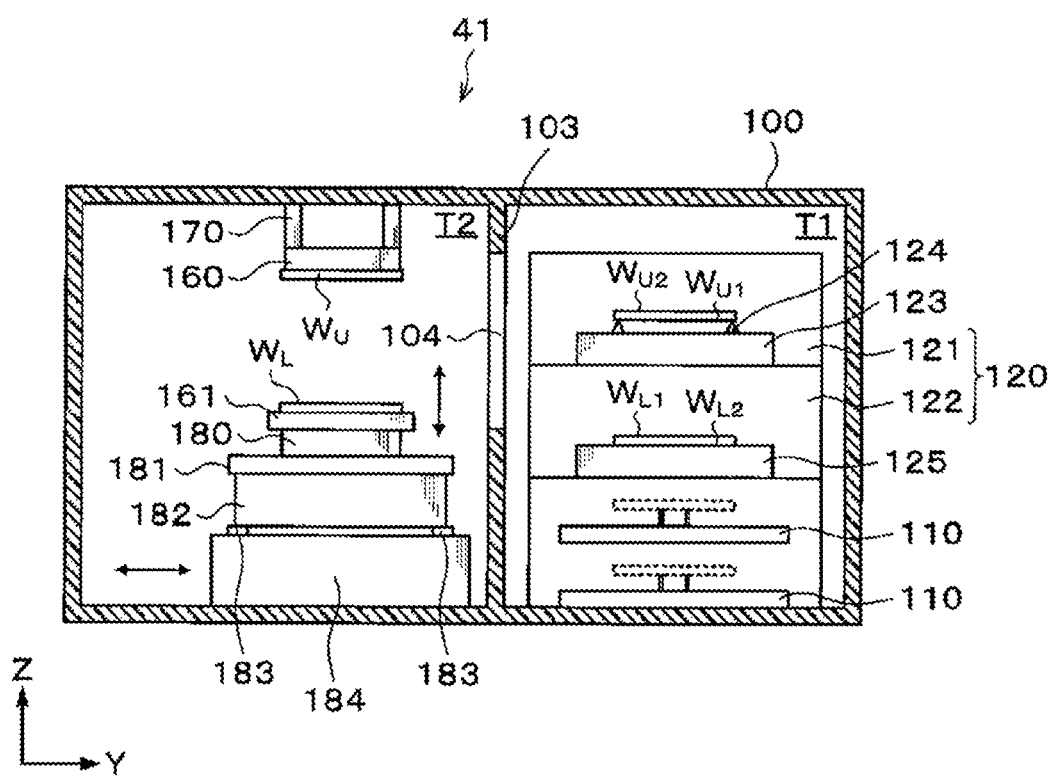
FIG. 5 is a vertical sectional view showing the schematic configuration of the joining device.

At the X-direction positive side of the transfer region T1, as shown in FIGS. 4 and 5, there are installed transitions 110 for temporarily mounting the upper and lower wafers $W_U$ and $W_L$ and the superposed wafer $W_T$ and a temperature adjustment mechanism 120 for controlling the temperatures of the upper and lower wafers $W_U$ and $W_L$. The transitions 110 are formed in, e.g., two stages, and are capable of simultaneously mounting two of the upper and lower wafers $W_U$ and $W_L$ and the superposed wafer $W_T$.

The temperature adjustment mechanism 120 includes a first temperature adjustment unit 121 and a second temperature adjustment unit 122. The first temperature adjustment unit 121 and the second temperature adjustment unit 122 are installed one above another on the transitions 110. In the present embodiment, one first temperature adjustment unit 121 and one second temperature adjustment unit 122 are installed. However, the number of the first temperature adjustment unit 121 and the second temperature adjustment unit 122 is not limited thereto. Two or more first temperature adjustment units and two or more second temperature adjustment units may be installed.

The first temperature adjustment unit 121 includes a first temperature adjustment plate 123 as a temperature adjustment member configured to control the temperature of the upper wafer $W_U$ at a predetermined temperature. For example, a Peltier element (not shown) is arranged within the first temperature adjustment plate 123. The temperature of the first temperature adjustment plate 123 is controlled by, e.g., the control unit 70, whereby the temperature of the upper wafer $W_U$ mounted on the first temperature adjustment plate 123 is adjusted to a predetermined temperature.

A plurality of, e.g., three, gap pins 124 as support members for holding the outer peripheral portion of the upper wafer $W_U$ is installed on the first temperature adjustment plate 123. The upper wafer $W_U$ is transferred to the first temperature adjustment unit 121 in a state in which the front and rear surfaces thereof is inverted by an inverting mechanism 150 as described below, namely in a state in which the front surface $W_{U1}$ is oriented downward. In the first temperature adjustment unit 121, the outer peripheral portion of the front surface $W_{U1}$ of the upper wafer $W_U$, namely the outer peripheral portion of the front surface $W_{U1}$ on which a device is not formed, is held by the gap pins 124. It is therefore possible to prevent the device from being damaged.

The second temperature adjustment unit 122 includes a second temperature adjustment plate 125 configured to control the temperature of the lower wafer $W_L$ at a predetermined temperature. The second temperature adjustment plate 125 is identical in configuration with the first temperature adjustment plate 123. For example, a Peltier element (not shown) is arranged within the second temperature adjustment plate 125. The entirety of the rear surface $W_{L2}$ of the lower wafer $W_L$ is mounted on the second temperature adjustment plate 125. The temperature of the second temperature adjustment plate 125 is controlled by, e.g., the control unit 70, whereby the temperature of the lower wafer $W_L$ mounted on the second temperature adjustment plate 125 is adjusted to a predetermined temperature.

A wafer transfer mechanism 130 is installed in the transfer region T1. The wafer transfer mechanism 130 includes a transfer arm which can move, e.g., in the vertical direction and the horizontal direction (in the Y-direction and the X-direction) and about the vertical axis. The wafer transfer mechanism 130 is capable of transferring the upper and lower wafers $W_U$ and $W_L$ and the superposed wafer $W_T$ within the transfer region T1 or between the transfer region T1 and the processing region T2.

Figure 6:
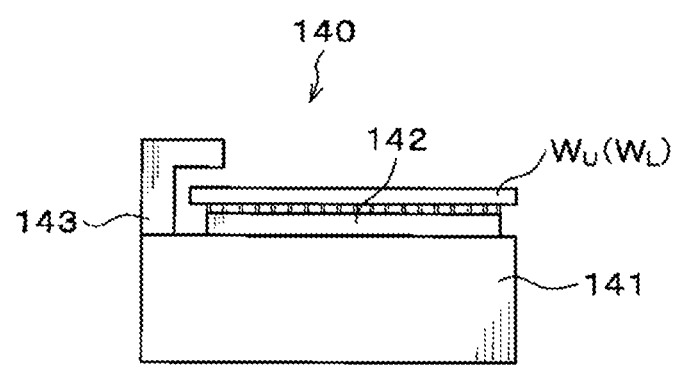
FIG. 6 is a side view showing a schematic configuration of a position adjustment mechanism.

A position adjustment mechanism 140 configured to adjust an orientation in the horizontal direction of the upper and lower wafers $W_U$ and $W_L$ is installed at the X-direction negative side of the transfer region T1. As shown in FIG. 6, the position adjustment mechanism 140 includes a base 141, a holding unit 142 configured to hold the upper or lower wafer $W_U$ or $W_L$ by a pin chuck system to rotate the upper or lower wafer $W_U$ or $W_L$, and a detecting unit 143 configured to detect the position of a notch portion of the upper or lower wafer $W_U$ or $W_L$. The pin chuck system employed in the holding unit 142 is the same as the pin chuck system employed in an upper chuck 160 and a lower chuck 161 to be described later and, therefore, will not be described here. In the position adjustment mechanism 140, the detecting unit 143 detects the position of the notch portion of the upper or lower wafer $W_U$ or $W_L$ while rotating the upper or lower wafer $W_U$ or $W_L$ held in the holding unit 142. Thus, the position adjustment mechanism 140 adjusts the position of the notch portion and adjusts the horizontal direction orientation of the upper or lower wafer $W_U$ or $W_L$.

Figure 7:
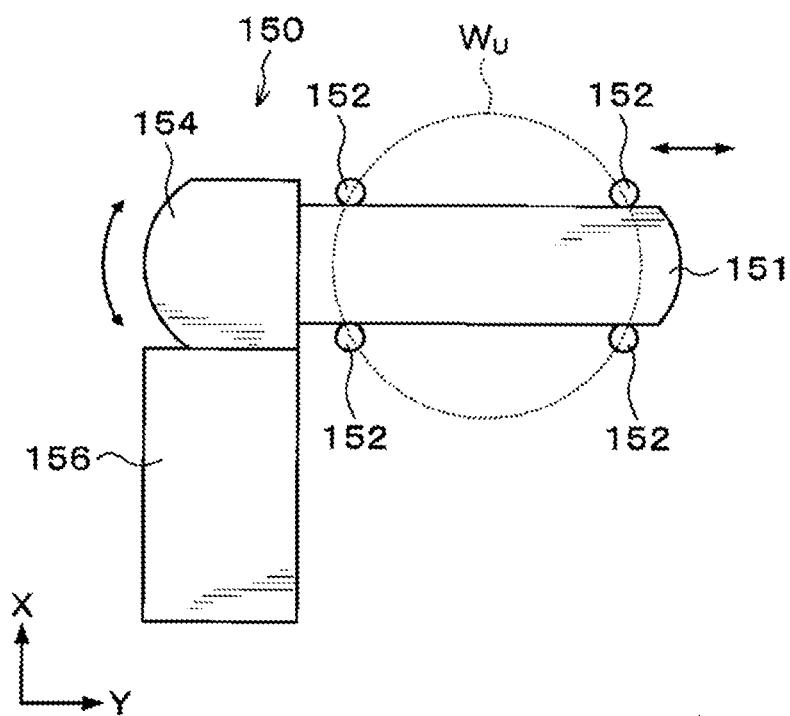
FIG. 7 is a plan view showing a schematic configuration of an inverting mechanism.
Figure 8:
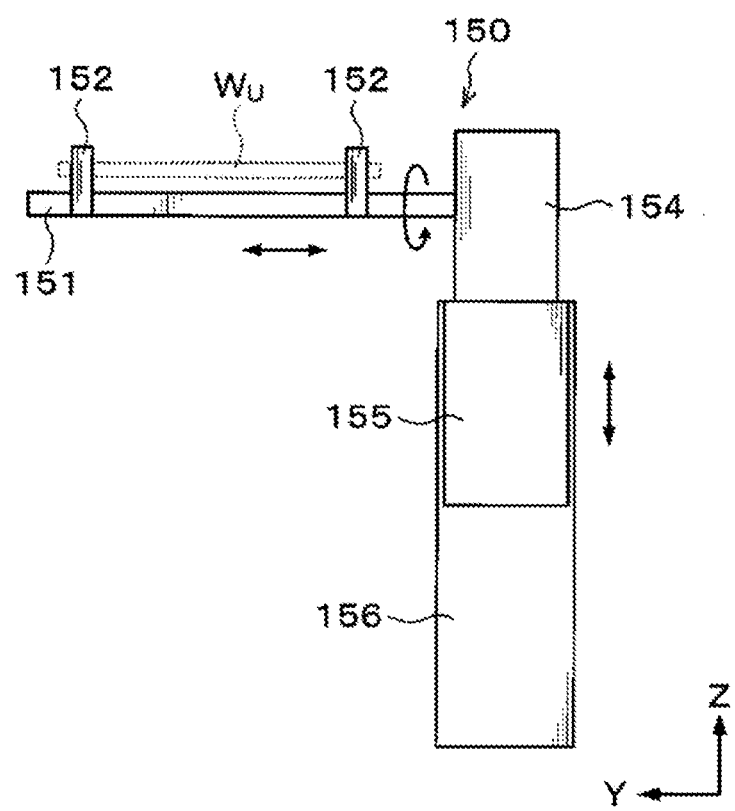
FIG. 8 is a side view showing the schematic configuration of the inverting mechanism.
Figure 9:
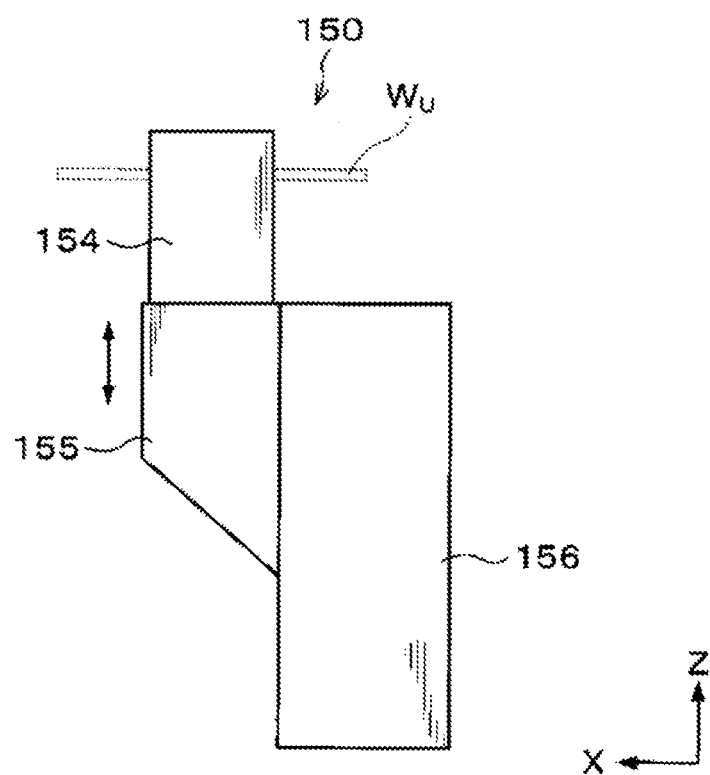
FIG. 9 is a side view showing the schematic configuration of the inverting mechanism.
Figure 10:
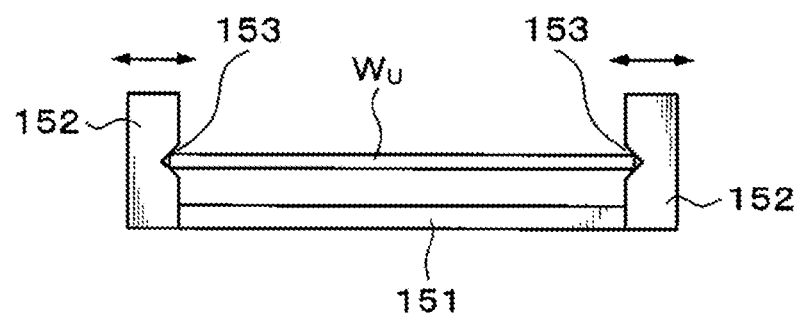
FIG. 10 is a side view showing schematic configurations of a holding arm and a holding member.

In the transfer region T1, there is also installed an inverting mechanism 150 configured to invert the front and rear surfaces of the upper wafer $W_U$. As shown in FIGS. 7 to 9, the inverting mechanism 150 includes a holding arm 151 configured to hold the upper wafer $W_U$. The holding arm 151 extends in the horizontal direction (in the Y-direction in FIGS. 7 and 8). In the holding arm 151, holding members 152 configured to hold the upper wafer $W_U$ are installed at, e.g., four points. As shown in FIG. 10, the holding members 152 are configured to move in the horizontal direction with respect to the holding arm 151. Cutouts 153 for holding the outer peripheral portion of the upper wafer $W_U$ is formed on the side surfaces of the holding members 152. The holding members 152 can hold the upper wafer $W_U$ interposed therebetween.

As shown in FIGS. 7 to 9, the holding arm 151 is supported by a first drive unit 154 provided with, e.g., a motor and the like. The holding arm 151 can be rotated about a horizontal axis by the first drive unit 154. The holding arm 151 is not only rotatable about the first drive unit 154 but also movable in the horizontal direction (in the Y-direction in FIGS. 7 and 8). A second drive unit 155 provided with, e.g., a motor and the like, is installed below the first drive unit 154. By virtue of the second drive unit 155, the first drive unit 154 can be moved in the vertical direction along a support post 156 extending in the vertical direction. Thus, the upper wafer $W_U$ held in the holding members 152 can be rotated about the horizontal axis and can be moved in the vertical direction and the horizontal direction by the first drive unit 154 and the second drive unit 155. The upper wafer $W_U$ held in the holding members 152 can swing about the first drive unit 154 and can move from the position adjustment mechanism 140 to an upper chuck 160 which will be described later.

In the processing region T2, as shown in FIGS. 4 and 5, there are installed an upper chuck 160 as a first holding unit that attracts and holds the upper wafer $W_U$ on the lower surface thereof and a lower chuck 161 as a second holding unit that mounts and holds the lower wafer $W_L$ on the upper surface thereof. The lower chuck 161 is installed below the upper chuck 160 and is configured to face the upper chuck 160. That is to say, the upper wafer $W_U$ held in the upper chuck 160 and the lower wafer $W_L$ held in the lower chuck 161 can be arranged to face each other.

Figure 11:
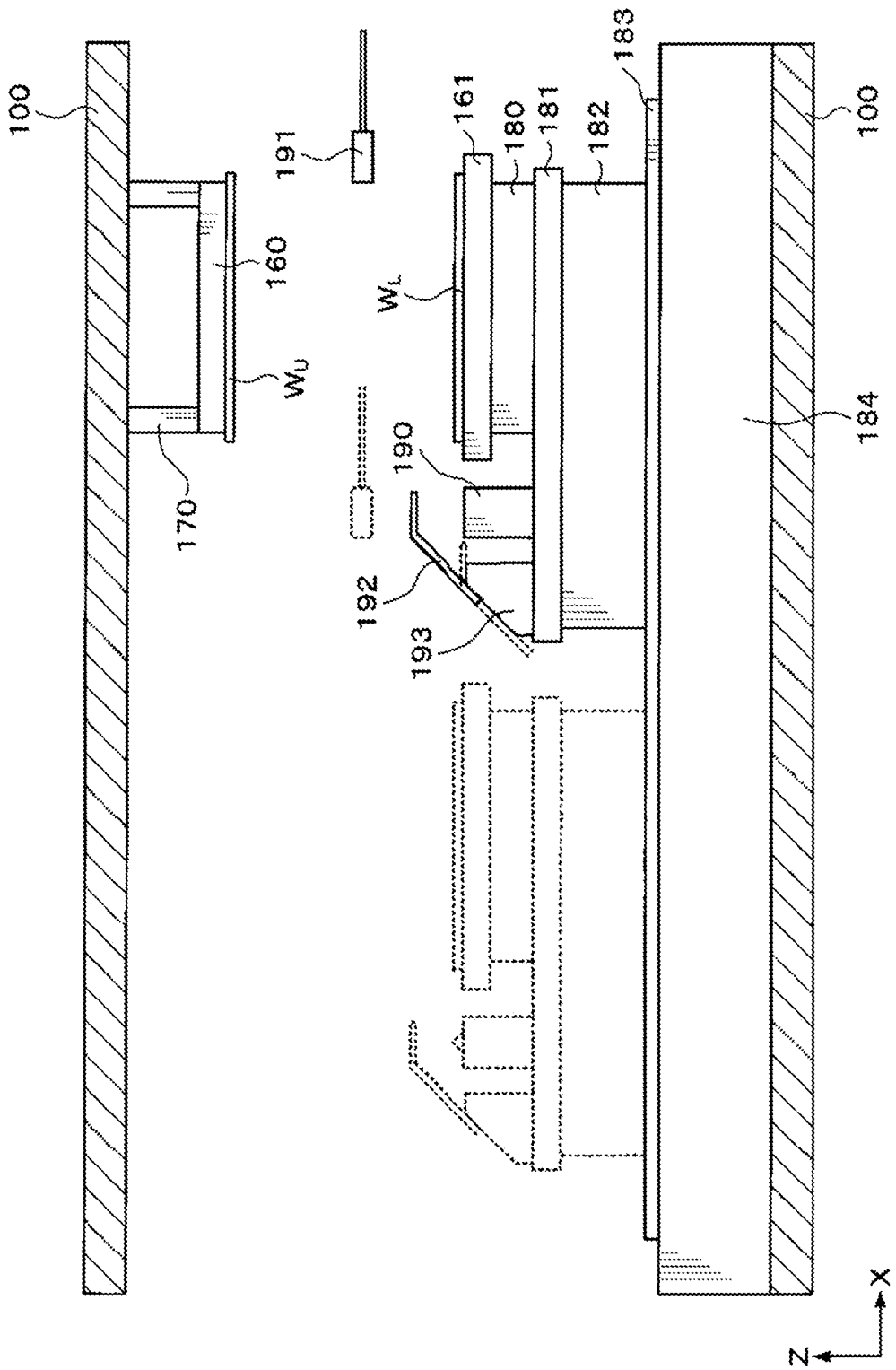
FIG. 11 is a side view showing a schematic internal configuration of the joining device.

As shown in FIG. 11, the upper chuck 160 is supported by an upper chuck support portion 170 installed above the upper chuck 160. The upper chuck support portion 170 is installed on the ceiling surface of the processing vessel 100.

The lower chuck 161 is supported by a lower chuck support portion 180 installed below the lower chuck 161. The lower chuck support portion 180 is supported by a support member 181 installed below the lower chuck support portion 180.

A lower chuck moving unit 182 configured to move the lower chuck 161 in the horizontal direction (the X-direction) is installed at the side of the lower surface of the support member 181. The lower chuck moving unit 182 is installed on a pair of rails 183 extending in the horizontal direction (the X-direction). The lower chuck moving unit 182 is configured to move along the rails 183 and 183.

The rails 183 and 183 are arranged on a mounting stand 184 installed on the bottom surface of the processing vessel 100. The mounting stand 184 can be moved in the horizontal direction (the Y-direction) by a moving mechanism (not shown). The lower chuck moving unit 182 is configured such that it can be moved in the vertical direction and can be rotated about the vertical axis by a moving mechanism (not shown) installed within the mounting stand 184.

A position adjustment mechanism configured to adjust the horizontal positions of the upper chuck 160 and the lower chuck 161 is installed within the processing vessel 100. More specifically, a chuck camera 190 configured to image the upper wafer $W_U$ held in the upper chuck 160, a bridge camera 191 configured to image the lower wafer $W_L$ held in the lower chuck 161, and a target 192 serving as a common reference when adjusting the horizontal positions of the chuck camera 190 and the bridge camera 191 are installed within the processing vessel 100. The chuck camera 190 images the lower surface of the target 192 from below. The bridge camera 191 images the upper surface of the target 192 from above. For example, CCD cameras are used as the chuck camera 190 and the bridge camera 191.

The chuck camera 190 and the target 192 are installed on the support member 181. The target 192 is supported by a target stand 193. For example, a glass plate having a vapor-deposited circular metal film, which is image-recognizable by the bridge camera 191 and the chuck camera 190, is used as the target 192. The target 192 can be obliquely moved by a drive mechanism (not shown) installed in the target stand 193 and can be retreated to the position indicated by a broken line in FIG. 11.

The bridge camera 191 is disposed above the lower chuck 161. The bridge camera 191 is configured such that it can be moved in the horizontal direction (the X-direction) by a moving mechanism (not shown).

Next, description will be made on the detailed configurations of the upper chuck 160 and the lower chuck 161 of the joining device 41.

Figure 12:
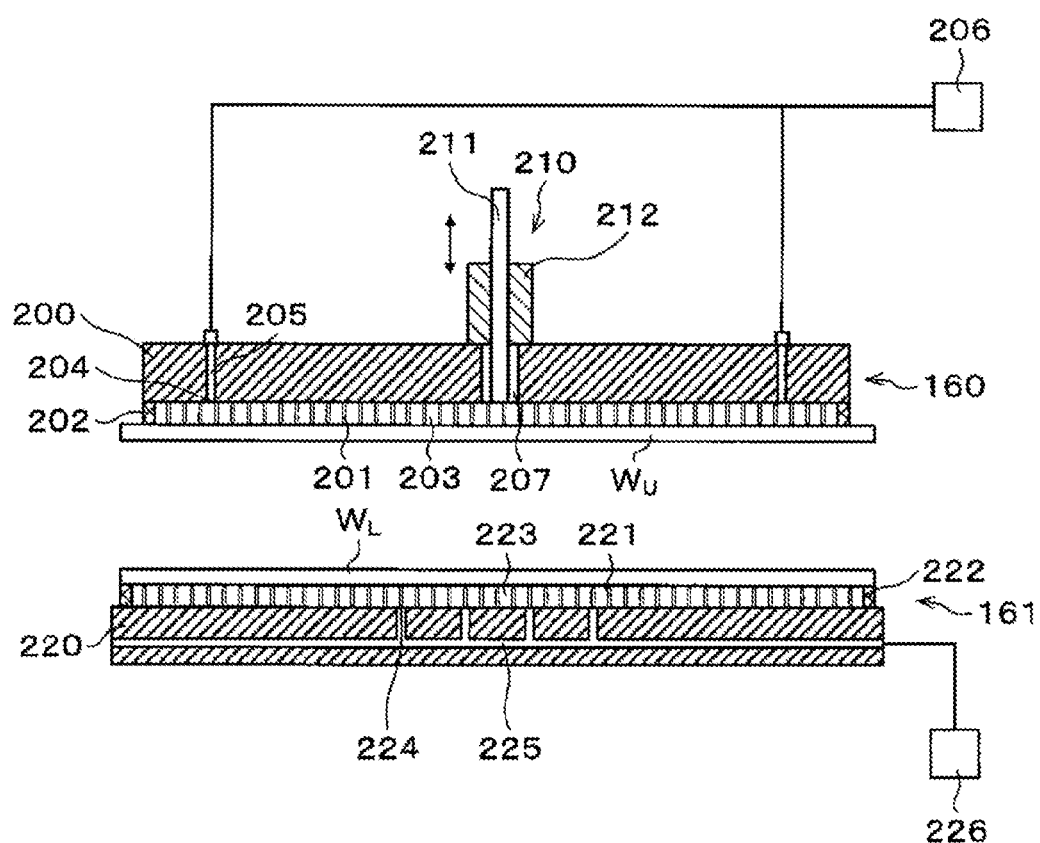
FIG. 12 is a vertical sectional view showing schematic configurations of an upper chuck and a lower chuck.
Figure 13:
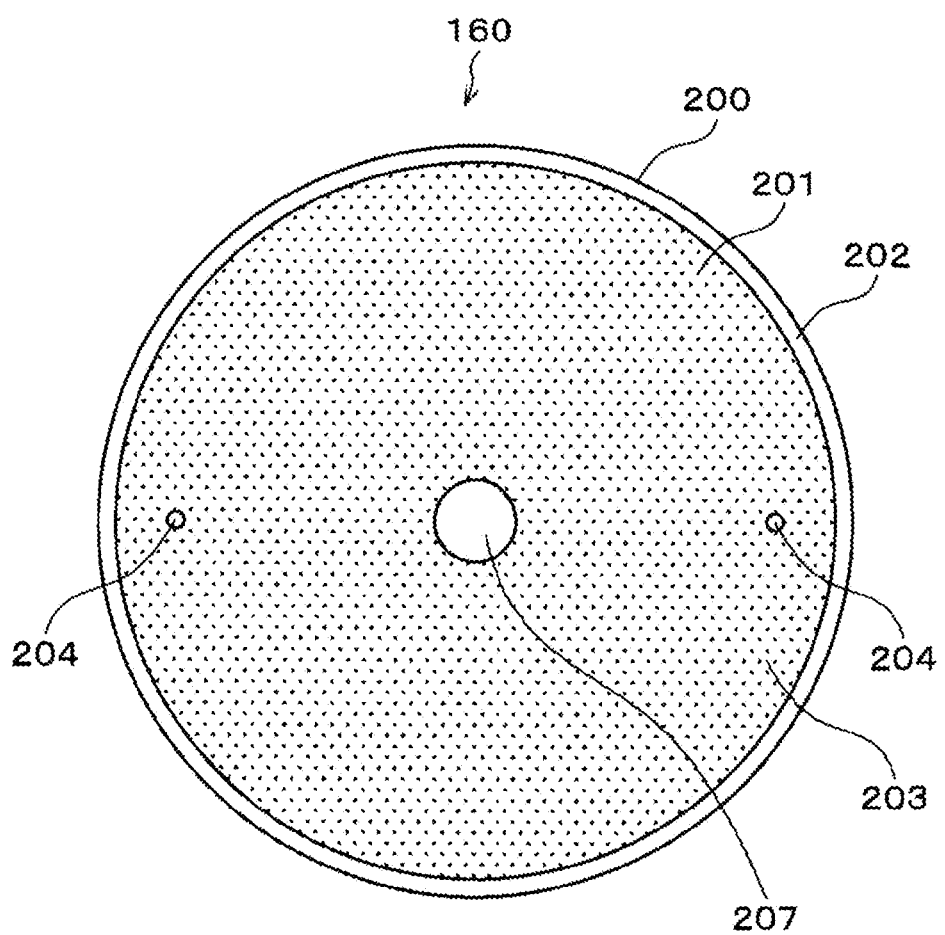
FIG. 13 is a plan view of the upper chuck seen from below.

As shown in FIGS. 12 and 13, a pin chuck system is employed in the upper chuck 160. The upper chuck 160 includes a body portion 200 having a diameter smaller than the diameter of the upper wafer $W_U$ when seen in a plan view. A plurality of pins 201 which makes contact with the rear surface $W_{U2}$ of the upper wafer $W_U$ is installed on the lower surface of the body portion 200. Moreover, an outer wall portion 202 configured to support the outer peripheral portion of the rear surface $W_{U2}$ of the upper wafer $W_U$ is installed on the lower surface of the body portion 200. The outer wall portion 202 is annularly installed at the outer side of the pins 201.

Suction holes 204 for vacuum-drawing the upper wafer $W_U$ in an inner region 203 of the outer wall portion 202 (hereinafter sometimes referred to as a "suction region 203") are formed on the lower surface of the body portion 200. The suction holes 204 are formed at, e.g., two points, in the outer peripheral portion of the suction region 203. Suction pipes 205 installed within the body portion 200 are connected to the suction holes 204. A vacuum pump 206 is connected to the suction pipes 205 through joints.

The suction region 203 surrounded by the upper wafer $W_U$, the body portion 200 and the outer wall portion 202 is vacuum-drawn from the suction holes 204, whereby the suction region 203 is depressurized. At this time, the external environment of the suction region 203 is kept at atmospheric pressure. Thus, the upper wafer $W_U$ is pressed toward the suction region 203 to the extent corresponding to the depressurized degree depressurized. Consequently, the upper wafer $W_U$ is attracted and held by the upper chuck 160.

In this case, it is possible to reduce the flatness of the lower surface of the upper chuck 160 because the pins 201 are uniform in height. By making the lower surface of the upper chuck 160 flat (by reducing the flatness of the lower surface of the upper chuck 160) in this manner, it is possible to suppress vertical distortion of the upper wafer $W_U$ held in the upper chuck 160. Since the rear surface $W_{U2}$ of the upper wafer $W_U$ is supported on the pins 201, the upper wafer $W_U$ is easily detached from the upper chuck 160 when the vacuum-drawing being applied on the upper wafer $W_U$ by the upper chuck 160 is released.

A through-hole 207 extending in the thickness direction of the body portion 200 is formed in the central region of the body portion 200. The central region of the body portion 200 corresponds to the central region of the upper wafer $W_U$ attracted and held by the upper chuck 160. A pressing pin 211 of a pressing member 210 to be described below is inserted into the through-hole 207.

A pressing member 210 configured to press the central region of the upper wafer $W_U$ is installed on the upper surface of the upper chuck 160. The pressing member 210 has a cylindrical structure. The pressing member 210 includes a pressing pin 211 and an outer cylinder 212 serving as a guide when the pressing pin 211 is moved up and down. By virtue of a drive unit (not shown) provided with, e.g., a motor therein, the pressing pin 211 can be moved up and down in the vertical direction through the through-hole 207. When joining the upper and lower wafers $W_U$ and $W_L$ in the below-mentioned manner, the pressing member 210 can bring the central region of the upper wafer $W_U$ into contact with the central region of the lower wafer $W_L$ and can press the central region of the upper wafer $W_U$ against the central region of the lower wafer $W_L$.

Figure 14:
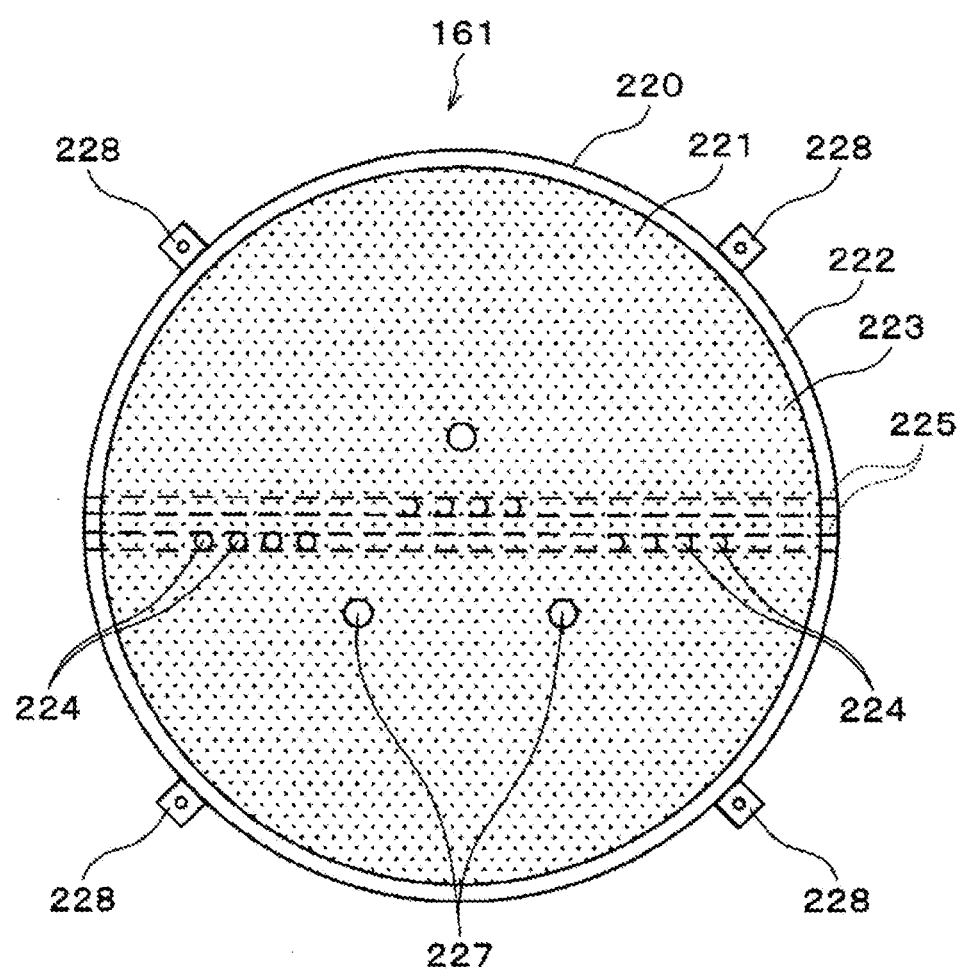
FIG. 14 is a plan view of the lower chuck seen from above.

As shown in FIGS. 12 and 14, just like the upper chuck 160, the lower chuck 161 employs a pin chuck system. The lower chuck 161 includes a body portion 220 having a diameter larger than the diameter of the lower wafer $W_L$ when seen in a plan view. A plurality of pins 221 with which the rear surface $W_{L2}$ of the lower wafer $W_L$ makes contact is installed on the upper surface of the body portion 220. Moreover, an outer wall portion 222 configured to support the outer peripheral portion of the rear surface $W_{L2}$ of the lower wafer $W_L$ is installed on the upper surface of the body portion 220. The outer wall portion 222 is annularly installed at the outer side of the pins 221.

Suction holes 224 for vacuum-drawing the lower wafer $W_L$ in an inner region 223 of the outer wall portion 222 (hereinafter sometimes referred to as a "suction region 223") are formed on the upper surface of the body portion 220. Suction pipes 225 installed within the body portion 220 are connected to the suction holes 224. For example, two suction pipes 225 are installed within the body portion 220. A vacuum pump 226 is connected to the suction pipes 225.

The suction region 223 surrounded by the lower wafer $W_L$, the body portion 220 and the outer wall portion 222 is vacuum-drawn from the suction holes 224, whereby the suction region 223 is depressurized. At this time, the external environment of the suction region 223 is kept at atmospheric pressure. Thus, the lower wafer $W_L$ is pressed toward the suction region 223 to the extent corresponding to the depressurized degree. Consequently, the lower wafer $W_L$ is attracted and held by the lower chuck 161.

In this case, it is possible to reduce the flatness of the upper surface of the lower chuck 161 because the pins 221 are uniform in height. For example, even if particles exist within the processing vessel 100, it is possible to suppress the existence of particles on the upper surface of the lower chuck 161 because the interval of the adjoining pins 221 is appropriate. By making the upper surface of the lower chuck 161 flat (by reducing the flatness of the upper surface of the lower chuck 161) in this manner, it is possible to suppress vertical distortion of the lower wafer $W_L$ held in the lower chuck 161. Since the rear surface $W_{L2}$ of the lower wafer $W_L$ is supported on the pins 221, the lower wafer $W_L$ is easily detached from the lower chuck 161 upon releasing the vacuum-drawing applied on the lower wafer $W_L$ by the lower chuck 161.

Through-holes 227 extending in the thickness direction of the body portion 220 are formed at, e.g., three points, in and around the central region of the body portion 220. Lift pins installed below the lower chuck moving unit 182 are inserted into the through-holes 227.

Guide members 228 configured to prevent the upper or lower wafer $W_U$ or $W_L$ or the superposed wafer $W_T$ from jumping out and sliding down from the lower chuck 161 are installed in the outer peripheral portion of the body portion 220. The guide members 228 are installed at a plurality of points, e.g., four points, at a regular interval in the outer peripheral portion of the body portion 220.

The operations of the respective parts of the joining device 41 are controlled by the aforementioned control unit 70.

Figure 15:
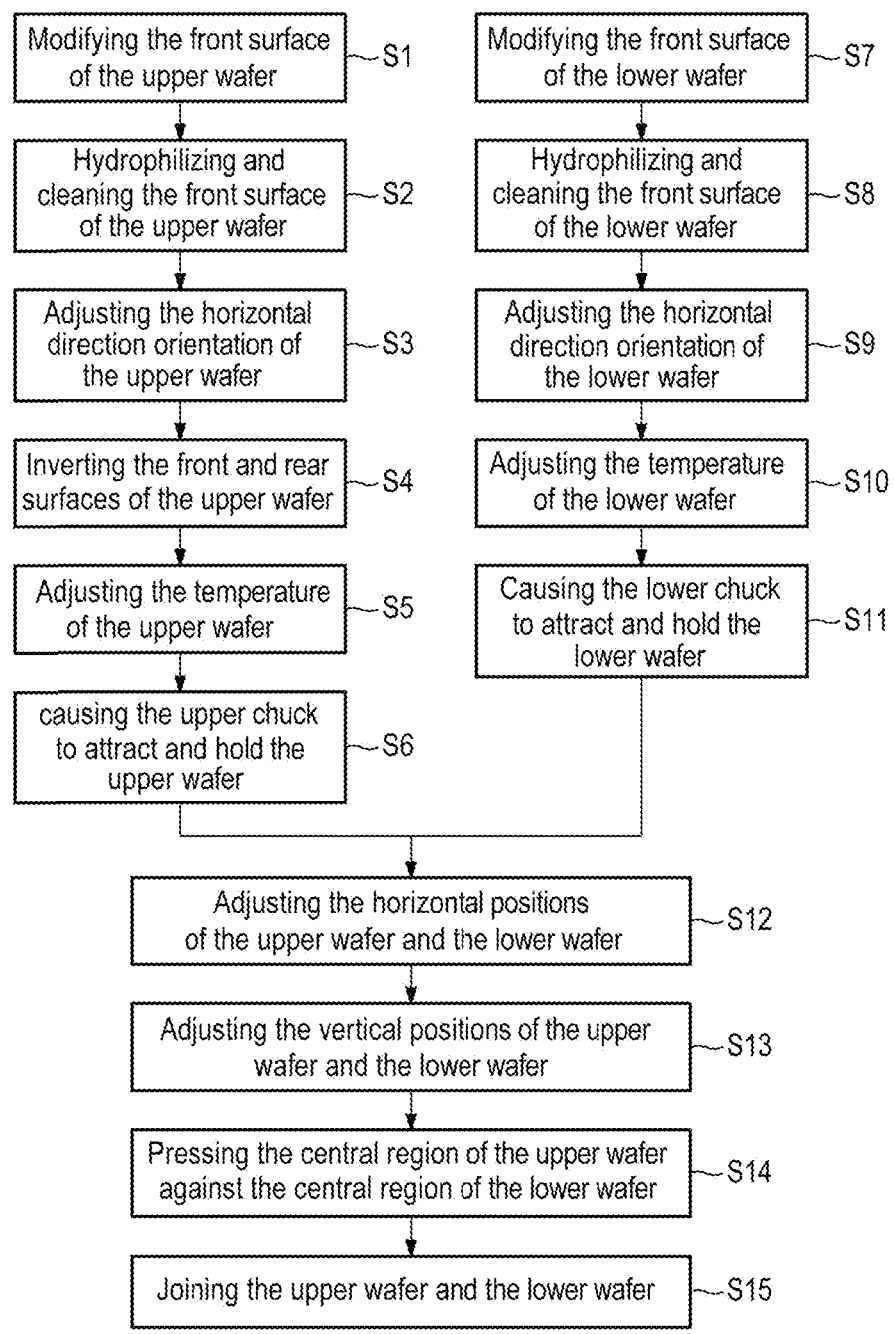
FIG. 15 is a flowchart showing major steps of a wafer joining process.

Next, description will be made on a process of joining the upper and lower wafers $W_U$ and $W_L$ performed by the joining system 1 configured as above. FIG. 15 is a flowchart illustrating examples of major steps of the wafer joining process.

First, the cassette $C_U$ accommodating a plurality of upper wafers $W_U$, the cassette $C_L$ accommodating a plurality of lower wafers $W_L$ and the empty cassette $C_T$ are mounted on the specified cassette mounting boards 11 of the carry-in/carry-out station 2. Thereafter, the upper wafer $W_U$ is taken out from the cassette $C_U$ by the wafer transfer device 22 and is transferred to the transition device 50 of the third processing block G3 in the processing station 3.

Then, the upper wafer $W_U$ is transferred to the surface modification device 30 of the first processing block G1 by the wafer transfer device 61. In the surface modification device 30, an oxygen gas as a process gas is excited, converted to plasma and ionized under a specified depressurized environment. The oxygen ions thus generated are irradiated on the front surface $W_{U1}$ of the upper wafer $W_U$, whereby the front surface $W_{U1}$ is plasma-processed. Thus, the front surface $W_{U1}$ of the upper wafer $W_U$ is modified (Step S1 in FIG. 15). The temperature of the upper wafer $W_U$ whose front surface $W_{U1}$ is modified in this way is kept at, e.g., 35 degrees C.

Next, the upper wafer $W_U$ is transferred to the surface hydrophilization device 40 of the second processing block G2 by the wafer transfer device 61. In the surface hydrophilization device 40, pure water is supplied onto the upper wafer $W_U$ while rotating the upper wafer $W_U$ held in a spin chuck. The pure water thus supplied is diffused on the front surface $W_{U1}$ of the upper wafer $W_U$. Hydroxyl groups (silanol groups) adhere to the front surface $W_{U1}$ of the upper wafer $W_U$ modified in the surface modification device 30, whereby the front surface $W_{U1}$ is hydrophilized. Furthermore, the front surface $W_{U1}$ of the upper wafer $W_U$ is cleaned by the pure water (Step S2 in FIG. 15). The temperature of the upper wafer $W_U$ whose front surface $W_{U1}$ is hydrophilized and cleaned in this way is kept at, e.g., 23 degrees C.

Then, the upper wafer $W_U$ is transferred to the joining device 41 of the second processing block G2 by the wafer transfer device 61. During the transfer, the temperature of the upper wafer $W_U$ is kept at, e.g., 22.5 degrees C. The upper wafer $W_U$ carried into the joining device 41 is transferred to the position adjustment mechanism 140 through the transition 110 by the wafer transfer mechanism 130. The horizontal direction orientation of the upper wafer $W_U$ is adjusted by the position adjustment mechanism 140 (Step S3 in FIG. 15). The temperature of the upper wafer $W_U$ whose horizontal direction orientation is adjusted in this way is kept at, e.g., 26 degrees C.

Thereafter, the upper wafer $W_U$ is delivered from the position adjustment mechanism 140 to the holding arm 151 of the inverting mechanism 150. Subsequently, in the transfer region T1, the holding arm 151 is inverted to thereby invert the front and rear surfaces of the upper wafer $W_U$ (Step S4 in FIG. 15). That is to say, the front surface $W_{U1}$ of the upper wafer $W_U$ is oriented downward. The temperature of the upper wafer $W_U$ whose front and rear surfaces are inverted in this way is kept at, e.g., 25.5 degrees C.

Thereafter, the upper wafer $W_U$ is transferred to the first temperature adjustment unit 121 by the inverting mechanism 150. In the first temperature adjustment unit 121, the upper wafer $W_U$ is held on the gap pins 124. The temperature of the upper wafer $W_U$ is adjusted to a predetermined temperature, e.g., 25 degrees C. by the first temperature adjustment plate 123 (Step S5 in FIG. 15).

Thereafter, the upper wafer $W_U$ is transferred below the upper chuck 160 by the inverting mechanism 150. Then, the upper wafer $W_U$ is delivered from the inverting mechanism 150 to the upper chuck 160. The rear surface $W_{U2}$ of the upper wafer $W_U$ is attracted and held by the upper chuck 160 (Step S6 in FIG. 15). More specifically, the vacuum pump 206 is operated to vacuum-draw the suction region 203 from the suction holes 204, whereby the upper wafer $W_U$ is attracted and held by the upper chuck 160.

The temperature of the upper wafer $W_U$ held in the upper chuck 160 in this way is adjusted to, e.g., 25 degrees C., in Step S5 mentioned above. That is to say, the temperature of the upper wafer $W_U$ is adjusted to the same temperature as the environmental temperature of the processing region T2. Thus, the upper wafer $W_U$ is not stretched or contracted by a temperature change and the shape and dimension thereof are not changed.

In particular, the upper chuck 160 holds the upper wafer $W_U$ using a pin chuck system. Therefore, the contact area between the upper chuck 160 and the upper wafer $W_U$ becomes small. In this case, if the temperature of the upper wafer $W_U$ is not adjusted, the shape or dimension of the upper wafer $W_U$ is easily changed. For that reason, the temperature adjustment performed in Step S5 so as to avoid a change in the shape and dimension of the upper wafer $W_U$ is particularly useful.

During the time when the processing of steps S1 to S6 is performed with respect to the upper wafer $W_U$, the lower wafer $W_L$ is processed. First, the lower wafer $W_L$ is taken out from the cassette $C_L$ by the wafer transfer device 22 and is transferred to the transition device 50 of the processing station 3.

Next, the lower wafer $W_L$ is transferred to the surface modification device 30 by the wafer transfer device 61. The front surface $W_{L1}$ of the lower wafer $W_L$ is modified in the surface modification device 30 (Step S7 in FIG. 15). The modification of the front surface $W_{L1}$ of the lower wafer $W_L$ performed in Step S7 is the same as the modification performed in Step S1.

Thereafter, the lower wafer $W_L$ is transferred to the surface hydrophilization device 40 by the wafer transfer device 61. The front surface $W_{L1}$ of the lower wafer $W_L$ is hydrophilized and cleaned in the surface hydrophilization device 40 (Step S8 in FIG. 15). The hydrophilizing and cleaning of the front surface $W_{L1}$ of the lower wafer $W_L$ performed in Step S8 is the same as the hydrophilizing and cleaning performed in Step S2.

Thereafter, the lower wafer $W_L$ is transferred to the joining device 41 by the wafer transfer device 61. The lower wafer $W_L$ carried into the joining device 41 is transferred to the position adjustment mechanism 140 through the transition 110 by the wafer transfer mechanism 130. The horizontal direction orientation of the lower wafer $W_L$ is adjusted by the position adjustment mechanism 140 (Step S9 in FIG. 15). The temperature of the lower wafer $W_L$ whose horizontal direction orientation is adjusted in this way is kept at, e.g., 26 degrees C.

Thereafter, the lower wafer $W_L$ is transferred to the second temperature adjustment unit 122 by the wafer transfer mechanism 130. In the second temperature adjustment unit 122, the lower wafer $W_L$ is mounted on the second temperature adjustment plate 125. The temperature of the lower wafer $W_L$ is adjusted to a predetermined temperature, e.g., 25 degrees C. (Step S10 in FIG. 15).

Thereafter, the lower wafer $W_L$ is transferred to the lower chuck 161 by the wafer transfer mechanism 130. The rear surface $W_{L2}$ of the lower wafer $W_L$ is attracted and held by the lower chuck 161 (Step S11 in FIG. 15). More specifically, the vacuum pump 226 is operated to vacuum-draw the suction region 223 from the suction holes 224, whereby the lower wafer $W_L$ is attracted and held by the lower chuck 161.

The temperature of the lower wafer $W_L$ held in the lower chuck 161 in this manner is adjusted to, e.g., 25 degrees C., namely the same temperature as the environmental temperature of the processing region T2, in step S10 mentioned above. Thus, the lower wafer $W_L$ is not stretched or contracted by a temperature change and the shape or dimension thereof is not changed. Since the lower chuck 161 employs a pin chuck system, the temperature adjustment of the lower wafer $W_L$ performed in Step S10 is particularly useful just like the temperature adjustment of the upper wafer $W_U$ performed in Step S5.

The temperature of the upper wafer $W_U$ held in the upper chuck 160 and the temperature of the lower wafer $W_L$ held in the lower chuck 161 are adjusted to the same temperature. Accordingly, no difference in shape and dimension exists between the upper wafer $W_U$ and the lower wafer $W_L$. This makes it possible to appropriately perform the below-mentioned adjustment of the positions of the upper wafer $W_U$ and the lower wafer $W_L$.

Next, the horizontal position of the upper wafer $W_U$ held in the upper chuck 160 and the horizontal position of the lower wafer $W_L$ held in the lower chuck 161 are adjusted.

Figure 16:
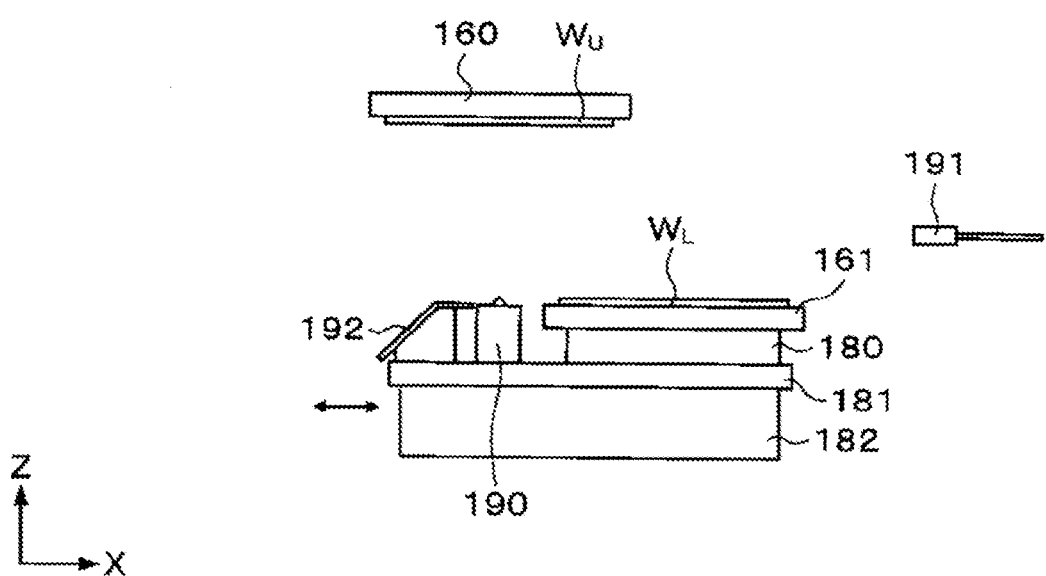
FIG. 16 is an explanatory view illustrating a state in which the surface of the upper wafer held in the upper chuck is imaged by a chuck camera.

First, as shown in FIG. 16, the lower chuck moving unit 182 is moved in the horizontal direction (the X-direction and the Y-direction). The front surface $W_{U1}$ of the upper wafer $W_U$ held in the upper chuck 160 is imaged by the chuck camera 190.

Figure 17:
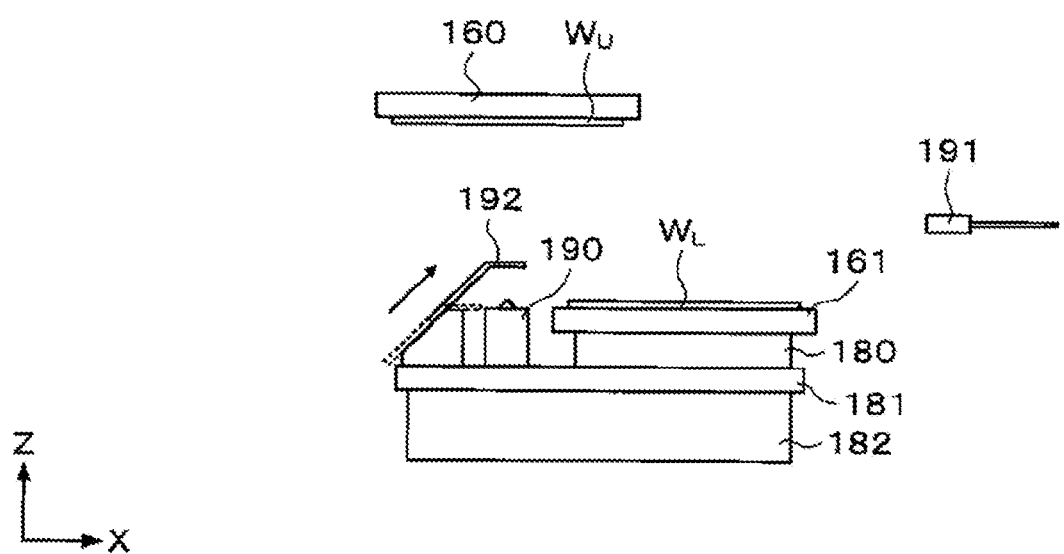
FIG. 17 is an explanatory view illustrating a state in which the horizontal positions of a chuck camera and a bridge camera are adjusted.
Figure 18:
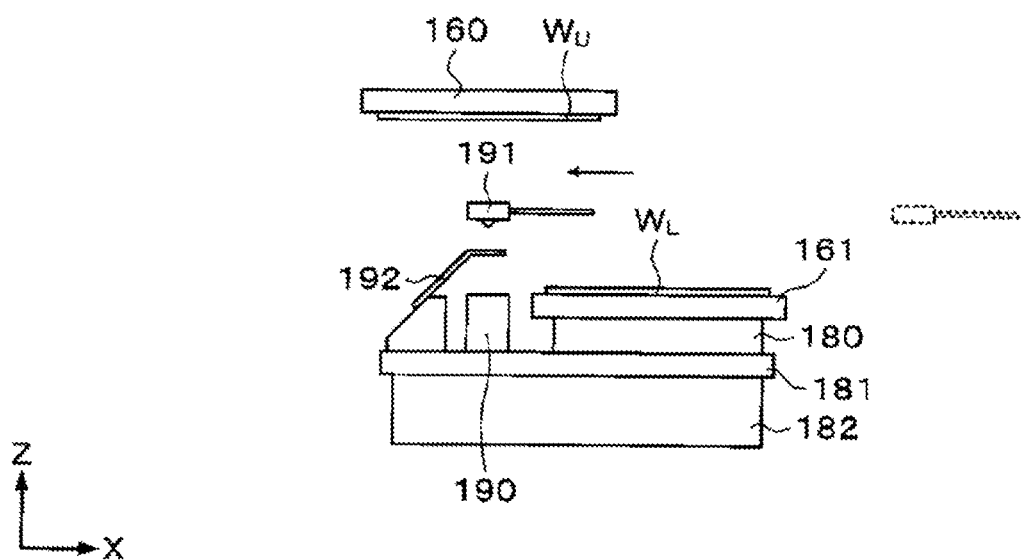
FIG. 18 is an explanatory view illustrating a state in which the horizontal positions of the chuck camera and the bridge camera are adjusted.

Thereafter, as shown in FIG. 17, the target 192 is moved to above the chuck camera 190. The center of the target 192, more specifically, the center of the metal film of the target 192 is identified by the chuck camera 190. Then, as shown in FIG. 18, the bridge camera 191 is moved to above the target 192. The center of the target 192 is identified by the bridge camera 191. In this way, the chuck camera 190 and the bridge camera 191 identify the center of the same target 192. Then, the horizontal positions of the chuck camera 190 and the bridge camera 191 are adjusted such that the horizontal position of the chuck camera 190 coincides with the horizontal position of the bridge camera 191.

Figure 19:
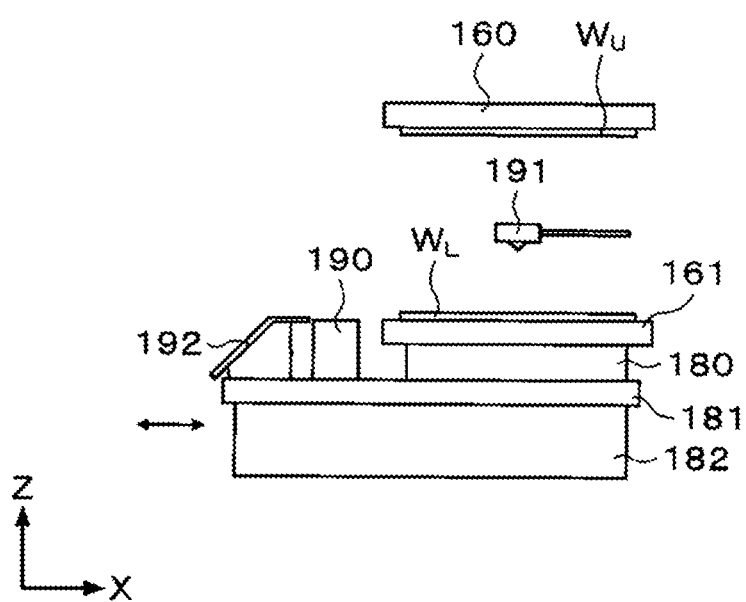
FIG. 19 is an explanatory view illustrating a state in which the surface of the lower wafer held in the lower chuck is imaged by the bridge camera to adjust the horizontal positions of the upper wafer and the lower wafer.

Thereafter, as shown in FIG. 19, the lower chuck moving unit 182 is moved in the horizontal direction (the X-direction and the Y-direction). The front surface $W_{L1}$ of the lower wafer $W_L$ held in the lower chuck 161 is imaged by the bridge camera 191.

Then, the horizontal position of the lower chuck 161 is adjusted such that a reference point (an alignment mark) on the front surface $W_{U1}$ of the upper wafer $W_U$ coincides with a reference point (an alignment mark) on the front surface $W_{L1}$ of the lower wafer $W_L$. In this way, the horizontal positions of the upper wafer $W_U$ and the lower wafer $W_L$ are adjusted (Step S12 in FIG. 15).

Figure 20:
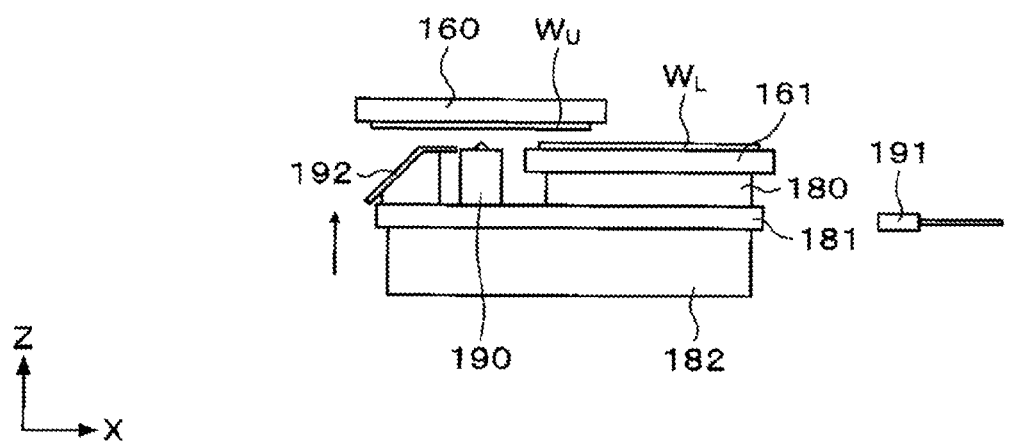
FIG. 20 is an explanatory view illustrating a state in which the vertical positions of the upper wafer and the lower wafer are adjusted.

Thereafter, as shown in FIG. 20, the lower chuck 161 is moved up by the lower chuck moving unit 182, whereby the lower wafer $W_L$ is arranged in a specified position. At this time, the lower wafer $W_L$ is arranged such that the gap between the front surface $W_{L1}$ of the lower wafer $W_L$ and the front surface $W_{U1}$ of the upper wafer $W_U$ becomes equal to a predetermined distance, e.g., 80 μm to 200 μm. In this way, the vertical positions of the upper wafer $W_U$ and the lower wafer $W_L$ are adjusted (Step S13 in FIG. 15).

Figure 21:
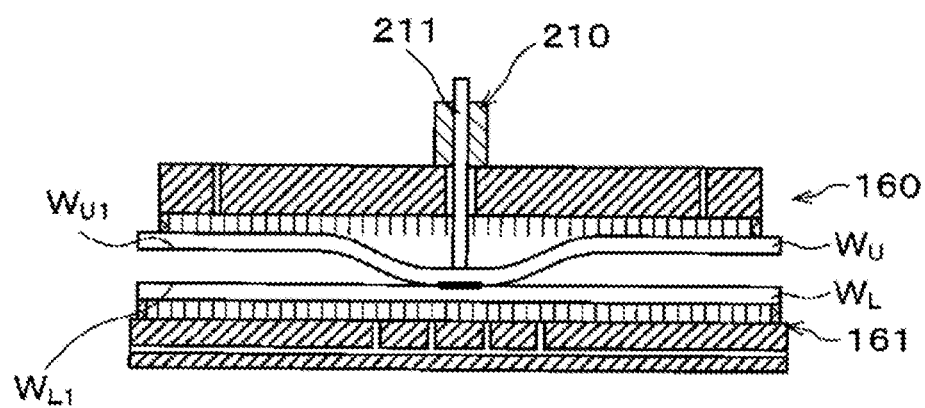
FIG. 21 is an explanatory view illustrating a state in which the central portion of the upper wafer and the central portion of the lower wafer are brought into contact with each other and are pressed against each other.

Thereafter, as shown in FIG. 21, the pressing pin 211 of the pressing member 210 is moved down, thereby moving the upper wafer $W_U$ downward while pressing the central region of the upper wafer $W_U$. At this time, a load of, e.g., 200 g, which enables the pressing pin 211 to move 70 μm in a state where the upper wafer $W_U$ does not exist, is applied to the pressing pin 211. By virtue of the pressing member 210, the central region of the upper wafer $W_U$ is brought into contact with, and pressed against, the central region of the lower wafer $W_L$ (Step S14 in FIG. 15). Since the suction holes 204 of the upper chuck 160 are formed in the outer peripheral portion of the suction region 203, it is possible for the upper chuck 160 to hold the outer peripheral portion of the upper wafer $W_U$ even when the pressing member 210 presses the central region of the upper wafer $W_U$.

Then, joining begins to occur between the central region of the upper wafer $W_U$ and the central region of the lower wafer $W_L$ pressed against each other (see the portion indicated by a thick line in FIG. 21). That is to say, the front surface $W_{U1}$ of the upper wafer $W_U$ and the front surface $W_{L1}$ of the lower wafer $W_L$ are previously modified in steps S1 and S7. Therefore, a Van der Waals force (an intermolecular force) is generated between the front surfaces $W_{U1}$ and $W_{L1}$, whereby the front surfaces $W_{U1}$ and $W_{L1}$ are joined to each other. Furthermore, the front surface $W_{U1}$ of the upper wafer $W_U$ and the front surface $W_{L1}$ of the lower wafer $W_L$ are previously hydrophilized in steps S2 and S8. Therefore, the hydrophilic groups of the front surfaces $W_{U1}$ and $W_{L1}$ are hydrogen-bonded (by an intermolecular force), whereby the front surfaces $W_{U1}$ and $W_{L1}$ are strongly joined to each other.

Figure 22:
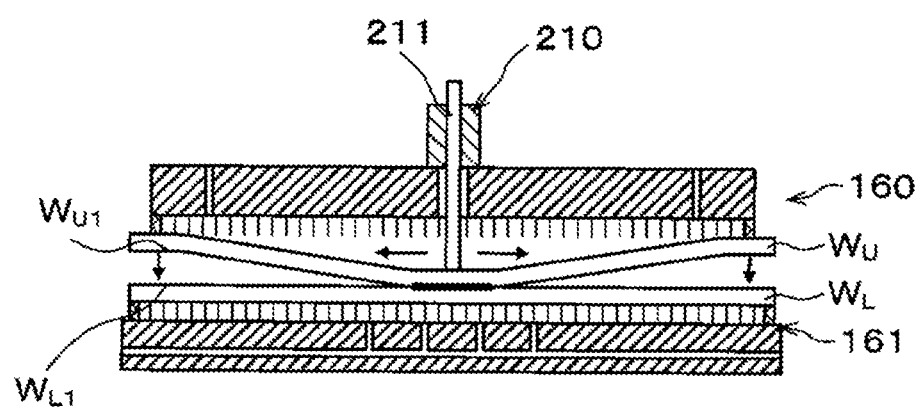
FIG. 22 is an explanatory view illustrating a state in which the upper wafer is sequentially brought into contact with the lower wafer.
Figure 23:
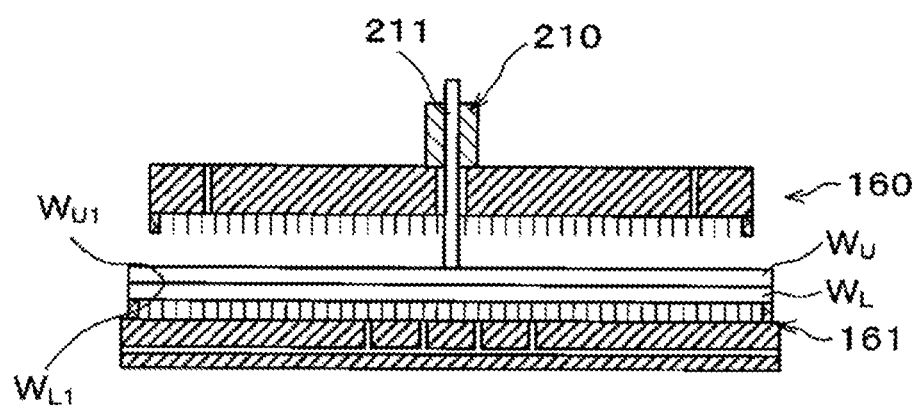
FIG. 23 is an explanatory view illustrating a state in which the surface of the upper wafer and the surface of the lower wafer have been brought into contact with each other.

Thereafter, as shown in FIG. 22, the vacuum-drawing of the upper wafer $W_U$ in the suction region 203 is stopped by stopping the operation of the vacuum pump 206 in a state in which the central region of the upper wafer $W_U$ and the central region of the lower wafer $W_L$ are pressed against each other by the pressing member 210. By doing so, the upper wafer $W_U$ is dropped onto the lower wafer $W_L$. Since the rear surface $W_{U2}$ of the upper wafer $W_U$ is supported by the pins 201, the upper wafer $W_U$ is easily detached from the upper chuck 160 upon releasing the vacuum-drawing applied on the upper wafer $W_U$ by the upper chuck 160. The vacuum-drawing applied on the upper wafer $W_U$ is stopped from the central region of the upper wafer $W_U$ toward the outer peripheral portion thereof. Thus, the upper wafer $W_U$ is gradually dropped onto, and gradually brought into contact with, the lower wafer $W_L$, whereby the joining area between the front surfaces $W_{U1}$ and $W_{L1}$ is gradually widened by a Van der Waals force and a hydrogen bond. Consequently, as shown in FIG. 23, the front surface $W_{U1}$ of the upper wafer $W_U$ and the front surface $W_{L1}$ of the lower wafer $W_L$ make contact with each other over the entire area thereof, whereby the upper wafer $W_U$ and the lower wafer $W_L$ are joined to each other (Step S15 in FIG. 15).

Figure 24:
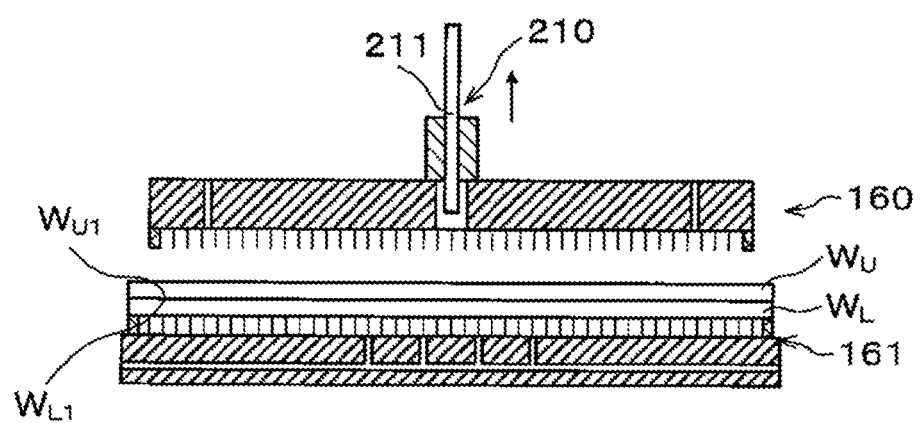
FIG. 24 is an explanatory view illustrating a state in which the upper wafer and the lower wafer have been joined to each other.

Thereafter, as shown in FIG. 24, the pressing pin 211 of the pressing member 210 is moved up to the upper chuck 160. Moreover, the operation of the vacuum pump 226 is stopped and the vacuum-drawing applied on the lower wafer $W_L$ in the suction region 223 is stopped such that the lower chuck 161 ceases to draw and hold the lower wafer $W_L$. Since the rear surface $W_{L2}$ of the lower wafer $W_L$ is supported by the pins 221, the lower wafer $W_L$ is easily detached from the lower chuck 161 upon releasing the vacuum-drawing applied on the lower wafer $W_L$ by the lower chuck 161.

The superposed wafer $W_T$ obtained by joining the upper wafer $W_U$ and the lower wafer $W_L$ is transferred to the transition device 51 by the wafer transfer device 61 and is then transferred to the cassette $C_T$ on a specified cassette mounting board 11 by the wafer transfer device 22 of the carry-in/carry-out station 2. As a result, the joining process of the upper and lower wafers $W_U$ and $W_L$ is finished.

According to the embodiment described above, just prior to the upper wafer $W_U$ being held by the upper chuck 160 in Step S6, the temperature of the upper wafer $W_U$ is adjusted to the same temperature as the environmental temperature of the processing region T2 in Step S5. Similarly, just prior to the lower wafer $W_L$ being held by the lower chuck 161 in Step S11, the temperature of the lower wafer $W_L$ is adjusted to the same temperature as the environmental temperature of the processing region T2 in Step S10. For that reason, the upper wafer $W_U$ and the lower wafer $W_L$ are not stretched or contracted by a temperature change in the subsequent steps, and the shape and dimension thereof is not changed. Since the temperatures of the upper wafer $W_U$ and the lower wafer $W_L$ are adjusted to the same temperature, no difference in shape and dimension exists between the upper wafer $W_U$ and the lower wafer $W_L$. Accordingly, it is possible to suppress variations in the shape and dimension of the upper and lower wafers $W_U$ and $W_L$ which may otherwise be caused by a temperature difference. In Step S12, it is possible to accurately perform the adjustment of the positions of the upper wafer $W_U$ and the lower wafer $W_L$. This makes it possible to appropriately perform the joining process of the upper and lower wafers $W_U$ and $W_L$.

Owing to the increased accuracy of the adjustment of the positions of the upper wafer Wu and the lower wafer $W_L$, it is possible to suppress generation of vertical distortion in the superposed wafer $W_T$ joined as above and, eventually, to increase the yield rate of products. The suppression of the vertical distortion in the superposed wafer $W_T$ is useful in, e.g., a wafer for a CMOS (Complementary Metal Oxide Semiconductor) sensor or a wafer for a BSI (Back Side Illumination) model.

The temperature adjustment mechanism 120 is installed independently of the upper chuck 160 and the lower chuck 161. Therefore, the adjustment of the temperatures of the upper wafer $W_U$ and the lower wafer $W_L$ does not affect the timing at which the adjustment of the positions of the upper wafer $W_U$ and the lower wafer $W_L$ is started. This makes it possible to increase the throughput of the joining process.

Since the temperature adjustment mechanism 120 is provided with the first temperature adjustment unit 121 and the second temperature adjustment unit 122, it is possible to independently adjust the temperatures of the upper wafer $W_U$ and the lower wafer $W_L$. Therefore, even if a difference exists in, e.g., the thickness or the material of the upper wafer $W_U$ and the lower wafer $W_L$, it is possible to appropriately adjust the temperatures of the upper wafer $W_U$ and the lower wafer $W_L$.

The first temperature adjustment unit 121 performs the temperature adjustment in a state in which the front surface $W_{U1}$ of the upper wafer $W_U$ faces downward. However, it is possible to prevent the devices formed on the front surface $W_{U1}$ from being damaged, because the outer peripheral portion of the front surface $W_{U1}$ of the upper wafer $W_U$ is held by the gap pins 124.

The temperature adjustment mechanism 120 is stacked and installed in the transition 110. In other words, the temperature adjustment mechanism 120 is disposed in an empty space of the joining device available in the related art. Therefore, despite the installation of the temperature adjustment mechanism 120, it is possible to reduce the exclusive area of the joining device 41.

The joining system 1 includes not only the joining device 41 but also the surface modification device 30 that modifies the front surfaces $W_{U1}$ and $W_{L1}$ of the upper and lower wafers $W_U$ and $W_L$ and the surface hydrophilization device 40 that hydrophilizes and cleans the front surfaces $W_{U1}$ and $W_{L1}$ of the upper and lower wafers $W_U$ and $W_L$. Accordingly, it is possible to efficiently perform the joining of the upper and lower wafers $W_U$ and $W_L$ within one system. This makes it possible to further increase the throughput of the wafer joining process.

The first temperature adjustment unit 121 of the aforementioned embodiment includes the first temperature adjustment plate 123 and the gap pins 124. However, the first temperature adjustment unit 121 is not limited to this configuration but may have many other configurations. For example, instead of using the first temperature adjustment plate 123 and the gap pins 124, a Peltier element (not shown) may be installed within a chuck having the same configuration as the upper chuck 160.

In the joining device 41 of the aforementioned embodiment, the temperature adjustment mechanism 120 is stacked and installed in the transition 110. However, the position of the temperature adjustment mechanism 120 is not limited thereto. The temperature adjustment mechanism 120 may be installed in other arbitrary places. For example, the temperature adjustment mechanism 120 may be installed within the processing region T2 or may be installed on the inverting mechanism 150 or the wafer transfer mechanism 130.

A temperature adjustment mechanism provided with, e.g., a Peltier element, may be installed within the holding unit 142 of the position adjustment mechanism 140. In this case, the temperatures of the upper wafer $W_U$ and the lower wafer $W_L$ are adjusted during or just after the adjustment of the horizontal direction orientation of the upper wafer $W_U$ and the lower wafer $W_L$ performed by the position adjustment mechanism 140.

In any of the cases mentioned above, it is possible to enjoy the same effects as obtained in the embodiment mentioned above. That is to say, it is possible to appropriately adjust the temperatures of the upper wafer $W_U$ and the lower wafer $W_L$ and to appropriately and rapidly perform the joining process of the upper and lower wafers $W_U$ and $W_L$.

As described above with respect to the embodiment, the specified temperature of the upper wafer $W_U$ adjusted in Step S5 and the specified temperature of the lower wafer $W_L$ adjusted in Step S10 are the same as the environmental temperature within the processing region T2. However, the specified temperatures may be set arbitrarily. For example, it is sometimes the case that the upper chuck 160 and the lower chuck 161 are thermally treated in order to suppress generation of air bubbles between the upper wafer $W_U$ and the lower wafer $W_L$ to be joined. In steps S5 and S10, the temperatures of the upper wafer $W_U$ and the lower wafer $W_L$ may be adjusted to the same temperature as the thermal treatment temperature of the upper chuck 160 and the lower chuck 161.

In the aforementioned embodiment, description has been made on an example where the upper wafer $W_U$ is a product wafer and the lower wafer $W_L$ is a support wafer. However, the present disclosure may be applied to a case where the upper wafer $W_U$ and the lower wafer $W_L$ are product wafers.

In the joining device 41 of the aforementioned embodiment, the lower chuck 161 and the bridge camera 191 are supported by the same support member 181. However, the lower chuck 161 and the bridge camera 191 may be supported by different support members.

In the joining system 1 of the aforementioned embodiment, after the upper and lower wafers $W_U$ and $W_L$ are joined in the joining device 41, the superposed wafer $W_T$ thus joined may be heated to a specified temperature (may be subjected to annealing). By performing the heat treatment with respect to the superposed wafer $W_T$, it is possible to have the joining interfaces strongly joined together.

According to the present disclosure, it is possible to appropriately adjust the positions of a first substrate held in a first holding unit and a second substrate held in a second holding unit and to appropriately perform the joining of the substrates.

While one embodiment of the present disclosure has been described above with reference to the accompanying drawings, the present disclosure is not limited to this embodiment. It will be apparent to those skilled in the relevant art that various changes or modifications can be made without departing from the spirit and scope of the claims. It is to be understood that these changes or modifications may well fall within the technical scope of the present disclosure. The present invention is not limited to the aforementioned embodiment but may employ may different forms. The present disclosure can be applied to a case where the substrate is not a wafer but other substrate such as a FPD (Flat Panel Display), a mask reticle for a photo mask, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A joining device for joining substrates with an intermolecular force, comprising:
  a first holding unit configured to hold a first substrate on a lower surface thereof, the first holding unit including a plurality of first pins which make contact with the first substrate when the first substrate is held by the first holding unit;
  a second holding unit installed below the first holding unit and configured to hold a second substrate on an upper surface thereof, the second holding unit including a plurality of second pins which make contact with the second substrate when the second substrate is held by the second holding unit; and
  a temperature adjustment mechanism configured to adjust a temperature of the first substrate before the first substrate is held in the first holding unit to a first predetermined temperature and a temperature of the second substrate before the second substrate is held in the second holding unit to a second predetermined temperature, the temperature of the second substrate being adjusted independently from adjusting the temperature of the first substrate so as to suppress the first substrate and the second substrate from being joined in a misaligned state.

2. The device of claim 1, further comprising:
  a position adjustment mechanism configured to adjust a horizontal direction orientation of the first substrate or the second substrate,
  wherein the temperature adjustment mechanism adjusts the temperature of the first substrate to the first predetermined temperature or the temperature of the second substrate to the second predetermined temperature after the horizontal direction orientation of the first substrate or the second substrate is adjusted and before the first substrate or the second substrate is held in the first holding unit or the second holding unit.

3. The device of claim 2, further comprising:
  an inverting mechanism configured to invert front and rear surfaces of the first substrate,
  wherein the temperature adjustment mechanism adjusts the temperature of the first substrate to the first predetermined temperature after the horizontal direction orientation of the first substrate is adjusted, after the front and rear surfaces of the first substrate are inverted and before the first substrate is held in the first holding unit.

4. The device of claim 2, wherein the temperature adjustment mechanism includes a first temperature adjustment unit configured to adjust the temperature of the first substrate and a second temperature adjustment unit configured to adjust the temperature of the second substrate.

5. The device of claim 4, wherein the first temperature adjustment unit includes a holding member configured to hold an outer peripheral portion of the first substrate and a temperature adjustment member configured to adjust the temperature of the first substrate held in the holding member.

6. The device of claim 2, further comprising:
  a transition configured to temporarily mount thereon the first substrate, the second substrate or a superposed substrate obtained by joining the first substrate and the second substrate, in order to carry the first substrate, the second substrate or the superposed substrate to and from the outside,
  wherein the temperature adjustment mechanism is stacked and installed in the transition.

7. The device of claim 1, further comprising:
  a position adjustment mechanism configured to adjust a horizontal direction orientation of the first substrate or the second substrate,
  wherein the temperature adjustment mechanism is installed in the position adjustment mechanism and configured to adjust the temperature of the first substrate to the first predetermined temperature or the temperature of the second substrate to the second predetermined temperature while the horizontal direction orientation of the first substrate or the second substrate is adjusted by the position adjustment mechanism.

8. A joining system provided with the joining device of claim 1, comprising:
  a processing station including the joining device; and
  a carry-in/carry-out station capable of holding a first substrate, a second substrate or a superposed substrate obtained by joining the first substrate and the second substrate and configured to carry the first substrate, the second substrate or the superposed substrate into and out of the processing station, wherein the processing station includes:

a surface modification device configured to modify a front surface of the first substrate or the second substrate to be joined, a surface hydrophilization device configured to hydrophilize the front surface of the first substrate or the second substrate modified in the surface modification device, and a transfer device configured to transfer the first substrate, the second substrate or the superposed surface with respect to the surface modification device, the surface hydrophilization device and the joining device, wherein the joining device joins the first substrate and the second substrate whose front surfaces are hydrophilized in the surface hydrophilization device.

9. A joining method for joining substrates with an intermolecular force, comprising:

a first temperature adjustment process of adjusting a temperature of a first substrate to a first predetermined temperature with a temperature adjustment mechanism;

a second temperature adjustment process of adjusting a temperature of a second substrate to a second predetermined temperature with the temperature adjustment mechanism, the temperature of the second substrate being adjusted independently from adjusting the temperature of the first substrate so as to suppress the first substrate and the second substrate from being joined in a misaligned state; and a joining process of holding on a lower surface of a first holding unit the first substrate whose temperature is adjusted in the first temperature adjustment process, holding on an upper surface of a second holding unit the second substrate whose temperature is adjusted in the second temperature adjustment process, and then joining the first substrate held in the first holding unit and the second substrate held in the second holding unit by disposing the first substrate and the second substrate to face each other, wherein the first holding unit includes a plurality of first pins which make contact with the first substrate when the first substrate is held by the first holding unit, and the second holding unit including a plurality of second pins which make contact with the second substrate when the second substrate is held by the second holding unit.

10. The method of claim 9, wherein the first temperature adjustment process or the second temperature adjustment process is performed after a horizontal direction orientation of the first substrate or the second substrate is adjusted by a position adjustment mechanism and before the joining process is performed.

11. The method of claim 10, wherein the first temperature adjustment process is performed after the horizontal direction orientation of the first substrate is adjusted by the position adjustment mechanism, after front and rear surfaces of the first substrate are inverted by an inverting mechanism and before the joining process is performed.

12. The method of claim 10, wherein the first temperature adjustment process is performed by a first temperature adjustment unit of the temperature adjustment mechanism, and the second temperature adjustment process is performed by a second temperature adjustment unit of the temperature adjustment mechanism.

13. The method of claim 9, wherein the first temperature adjustment process or the second temperature adjustment process is performed while a horizontal direction orientation of the first substrate or the second substrate is adjusted by a position adjustment mechanism.

* * * * *